US010020305B2

(12) United States Patent
Morii et al.

(10) Patent No.: US 10,020,305 B2
(45) Date of Patent: Jul. 10, 2018

(54) SEMICONDUCTOR DEVICE AND METHOD FOR MANUFACTURING THE SAME

(71) Applicant: Renesas Electronics Corporation, Tokyo (JP)

(72) Inventors: Katsumi Morii, Hitachinaka (JP); Yoshitaka Otsu, Hitachinaka (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/438,590

(22) Filed: Feb. 21, 2017

(65) Prior Publication Data
US 2017/0162572 A1  Jun. 8, 2017

Related U.S. Application Data

(63) Continuation of application No. 14/455,923, filed on Aug. 10, 2014, now Pat. No. 9,614,076.

(30) Foreign Application Priority Data

Aug. 12, 2013 (JP) .................................. 2013-167690

(51) Int. Cl.
*H01L 27/092* (2006.01)
*H01L 21/306* (2006.01)
(Continued)

(52) U.S. Cl.
CPC .... *H01L 27/0922* (2013.01); *H01L 21/30604* (2013.01); *H01L 21/31111* (2013.01);
(Continued)

(58) Field of Classification Search
CPC ........... H01L 27/088; H01L 21/823481; H01L 25/0753; H01L 29/7816; H01L 21/7605; H01L 27/0251; H01L 27/092
See application file for complete search history.

(56) References Cited

U.S. PATENT DOCUMENTS 4,256,514 A    3/1981  Pogge
5,675,173 A   10/1997  Kawai et al.
(Continued)

FOREIGN PATENT DOCUMENTS

JP    55-062733 A    5/1980
JP    62-213121 A    9/1987
(Continued)

OTHER PUBLICATIONS

Office Action, dated Dec. 20, 2016, in Japanese Application No. 2013-167690.
(Continued)

*Primary Examiner* — Marc Armand
*Assistant Examiner* — Quinton Brasfield
(74) *Attorney, Agent, or Firm* — Shapiro, Gabor and Rosenberger, PLLC

(57) ABSTRACT

There is formed a first concave portion that extends inside a semiconductor substrate from a main surface thereof. An insulating film is formed over the main surface, over a side wall and a bottom wall of the first concave portion so as to cover an element and to form a capped hollow in the first concave portion. A first hole portion is formed in the insulating film so as to reach the hollow in the first concave portion from an upper surface of the insulating film, and to reach the semiconductor substrate on the bottom wall of the first concave portion while leaving the insulating film over the side wall of the first concave portion. There is formed a second hole portion that reaches the conductive portion from the upper surface of the insulating film. The first and second hole portions are formed by the same etching treatment.

9 Claims, 20 Drawing Sheets

(51) Int. Cl.
| | |
|---|---|
| *H01L 21/311* | (2006.01) |
| *H01L 21/768* | (2006.01) |
| *H01L 29/417* | (2006.01) |
| *H01L 29/10* | (2006.01) |
| *H01L 29/06* | (2006.01) |
| *H01L 21/8238* | (2006.01) |
| *H01L 21/74* | (2006.01) |
| *H01L 23/528* | (2006.01) |

(52) U.S. Cl.
CPC ...... *H01L 21/743* (2013.01); *H01L 21/76802* (2013.01); *H01L 21/76877* (2013.01); *H01L 21/823814* (2013.01); *H01L 21/823871* (2013.01); *H01L 23/528* (2013.01); *H01L 29/0684* (2013.01); *H01L 29/1087* (2013.01); *H01L 29/1095* (2013.01); *H01L 29/41758* (2013.01)

(56) References Cited

U.S. PATENT DOCUMENTS

| | | | | |
|---|---|---|---|---|
| 6,184,101 | B1 * | 2/2001 | Tsuzuki | H01L 21/76224 257/513 |
| 7,122,438 | B2 | 10/2006 | Sasaki | |
| 7,256,119 | B2 * | 8/2007 | Grivna | H01L 21/743 257/E21.537 |
| 7,646,062 | B2 * | 1/2010 | Yamaoka | H01L 29/66553 257/207 |
| 7,655,974 | B2 | 2/2010 | Shimada et al. | |
| 8,294,203 | B2 | 10/2012 | Van Noort et al. | |
| 2002/0040994 | A1 * | 4/2002 | Nitta | H01L 21/76237 257/328 |
| 2008/0023787 | A1 * | 1/2008 | Shimada | H01L 21/761 257/506 |
| 2009/0189247 | A1 * | 7/2009 | Yamamoto | H01L 27/0629 257/510 |
| 2011/0124177 | A1 * | 5/2011 | Botula | H01L 21/743 438/424 |
| 2011/0284987 | A1 * | 11/2011 | Yoshihisa | H01L 21/76224 257/510 |

FOREIGN PATENT DOCUMENTS

| | | |
|---|---|---|
| JP | 05-029603 | 2/1993 |
| JP | 08-195433 A | 7/1996 |
| JP | 11-045890 | 2/1999 |
| JP | 2003-218356 A | 7/2003 |
| JP | 2007-266109 A | 10/2007 |
| JP | 2008-034649 A | 2/2008 |
| JP | 2008-511981 A | 4/2008 |
| JP | 2008-130829 A | 6/2008 |
| JP | 6130755 B2 | 5/2017 |

OTHER PUBLICATIONS

Office Action, dated Mar. 6, 2018, in Japanese Patent Application No. 2017-079770.

* cited by examiner

SEMICONDUCTOR DEVICE AND METHOD FOR MANUFACTURING THE SAME

CROSS-REFERENCE TO RELATED APPLICATION

The disclosure of Japanese Patent Application No. 2013-167690 filed on Aug. 12, 2013 including the specification, drawings and abstract is incorporated herein by reference in its entirety.

BACKGROUND

The present invention relates to a semiconductor device and a method for manufacturing the same, and in particular, to a semiconductor device having a concave portion and a method for manufacturing the same.

DESCRIPTION OF THE RELATED ART

On one (upper-side) main surface side of a pair of main surfaces of a semiconductor substrate, which face each other, may be formed a deep groove (concave portion) for taking out a potential of the other (lower-side) main surface side of the above-described pair of main surfaces. Such a deep concave portion for extracting the potential of the semiconductor substrate may be referred to as a substrate electrode or a substrate contact. The above-described substrate electrode is disclosed in, for example, Japanese Patent Laid-Open No. 2008-130829 (Patent Document 1), National Publication of International Patent Application No. 2008-511981 (Patent Document 2), Japanese Patent Laid-Open No. 05-29603 (Patent Document 3), Japanese Patent Laid-Open No. 62-213121 (Patent Document 4), and Japanese Patent Laid-Open No. 2003-218356 (Patent Document 5).

Furthermore, in, for example, Japanese Patent Laid-Open No. 11-45890 (Patent Document 6), disclosed is a technology to form a device isolation concave portion as a deep concave portion in one (upper-side) main surface of a pair of main surfaces of a semiconductor substrate for the purpose of electrically separating elements formed over the semiconductor substrate from the other region over the semiconductor substrate.

Prolonged heat treatment is needed in many cases, and manufacturing cost may be raised, in order to form the deep concave portion as shown in the above-described Patent Documents.

In addition, in addition to the process of forming the above-described deep concave portion in forming a semiconductor device, there may be usually needed, for example, a process of forming a concave portion for pulling out an electrode from the semiconductor device, the concave portion being shallower than the above-described deep concave portion, on the above-described one main surface side of the semiconductor substrate. The process of forming the deep concave portion and the process of forming the shallow concave portion are processed as separate processes in all the above-described Patent Documents. In this case, since processes become complicated, and the number of masks needed for forming the concave portion increases, manufacturing cost may be raised.

The other purposes and the new feature will become clear from the description of the present specification and the accompanying drawings.

SUMMARY

A method for manufacturing a semiconductor device of one embodiment includes the following processes. First, there is formed an element that has a conductive portion located at a main surface of a semiconductor substrate. There is formed a first concave portion that extends inside the semiconductor substrate from the above-described main surface. An insulating film is formed over the main surface, over a side wall and a bottom wall of the first concave portion so as to cover the above-described element, and to form a capped hollow in the first concave portion. A first hole portion is formed in the insulating film so as to reach the hollow in the first concave portion from an upper surface of the above-described insulating film, and to reach the semiconductor substrate on the bottom wall of the first concave portion while leaving the insulating film over the side wall of the first concave portion. There is formed a second hole portion that reaches the conductive portion from the upper surface of the above-described insulating film. The above-described first and second hole portions are formed by the same etching treatment.

A semiconductor device of the other embodiment includes the following configuration. The above-described semiconductor device includes: a semiconductor substrate that has a first concave portion; an element that has a conductive region; and an insulating film that is formed over a main surface so as to cover the element, and is formed so as to expose a semiconductor substrate on a first bottom wall of the first concave portion. There is formed a first hole portion that reaches the bottom wall of the first concave portion through an inside of the first concave portion from an upper surface of the insulating film, and there is formed a second hole portion that reaches the conductive region from the upper surface of the insulating film. The semiconductor device includes: a first conductive layer formed in the first hole portion; and a second conductive layer formed in the second hole portion. The first conductive layer and the second conductive layer include the same material.

According to the semiconductor device and the method for manufacturing the same pertaining to one embodiment and the other embodiment, the semiconductor device having the first concave portion can be provided by reduction in the number of processes, a treatment time, and manufacturing cost.

DETAILED DESCRIPTION

Hereinafter, one embodiment will be explained on the basis of drawings.

First Embodiment

First, using FIGS. 1 and 2, there will be explained arrangement of each element formation region on a main surface of a semiconductor substrate of a semiconductor device of the present embodiment.

Figure 1:
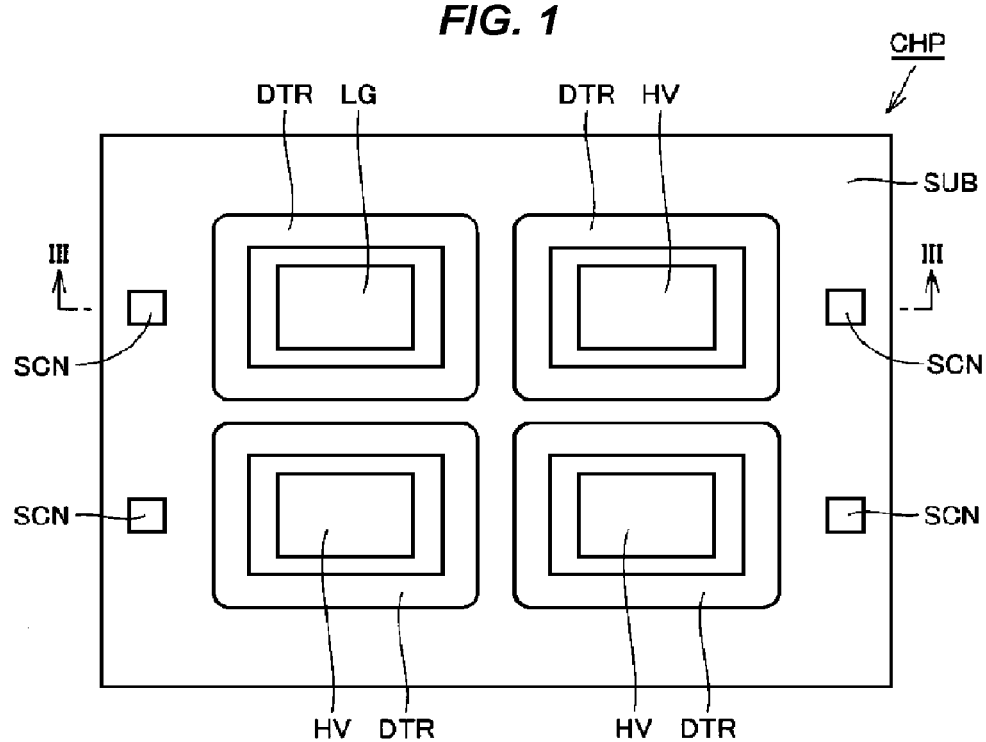
FIG. 1 is a schematic plan diagram showing a configuration of a semiconductor device in a chip state in a First Embodiment.

Referring to FIG. 1, the semiconductor device of the present embodiment, for example, has: a logic portion LG as a CMOS (Complementary MOS) transistor region in which a low-voltage CMOS transistor has been integrated; and an output driver portion HV as a high-voltage MOS transistor region using a high-voltage element, on a main surface of a semiconductor substrate SUB included in a semiconductor chip CHP. In the above-described semiconductor device, as one example, one logic portion LG and three output driver portions HV are arranged so as to be a matrix form in a plan view.

A substrate electrode region is arranged outside a region where the logic portion LG and the output driver portions HV are arranged (for example, a region comparatively near an outer edge of the semiconductor chip CHP), and substrate contacts SCN are formed in the substrate electrode region. However, positions at which the substrate contacts SCN are formed are not limited to an outer edge side of the semiconductor chip CHP, and they can be set as arbitrary positions. For example, the substrate contacts SCN may be formed in a center of the semiconductor chip CHP.

Figure 2:
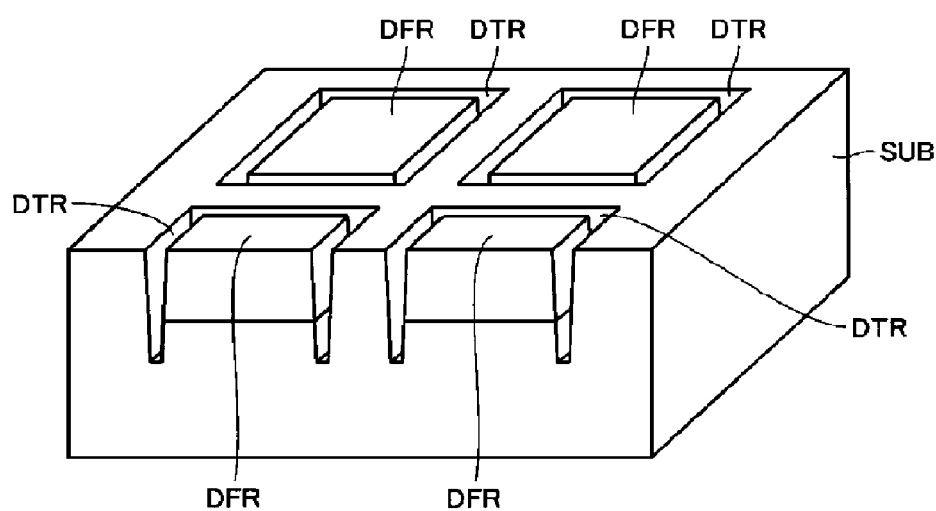
FIG. 2 is a partially broken perspective diagram showing that the element formation region shown in FIG. 1 has been surrounded by a concave portion in a plan view.

Referring to FIGS. 1 and 2, an element formation region DFR as the logic portion LG or the output driver portion HV is surrounded in a plan view by an element isolation region DTR as a so-called DTI (Deep Trench Isolation) structure having an insulating film in a concave portion with a high aspect ratio. The element isolation region DTR is formed on the main surface of semiconductor substrate SUB.

Next, a cross-sectional configuration of the above-described semiconductor device will be explained using FIG. 3.

Figure 3:
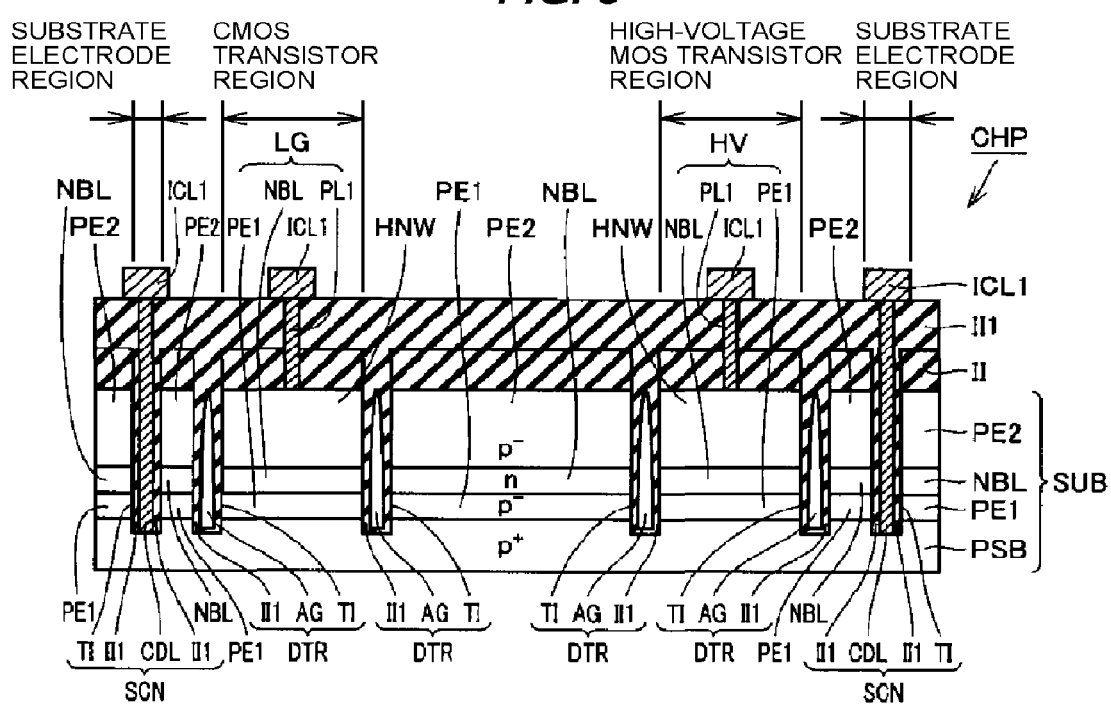
FIG. 3 is a schematic cross-sectional diagram in a portion along a line III-III of FIG. 1 showing the configuration of the semiconductor device in the chip state in the First Embodiment.

Referring to FIG. 3, the semiconductor substrate SUB has, for example, a configuration in which a p-type impurity region PSB, a p-type epitaxial layer PE1, an n-type buried layer NBL, and a p-type epitaxial layer PE2 have been stacked in this order.

The p-type impurity region PSB is a substrate region (as a p$^+$ region) having a comparatively high impurity concentration of a p-type (first conductive type), and is formed in a region (lowermost region of the semiconductor substrate SUB of FIG. 3) farthest from the main surface of the semiconductor substrate SUB on which the CMOS transistor and the like are formed.

The n-type buried layer NBL (a buried region) is a n-type impurity region formed so as to be located at a side (an upper side in FIG. 3) closer to the main surface on which the CMOS transistor and the like are formed than the p-type impurity region PSB in the semiconductor substrate SUB, the n-type impurity region having a medium n-type (second conductive-type) impurity concentration. The p-type epitaxial layers PE1 and PE2 are p$^-$ regions of having comparatively low p-type impurity concentrations.

These respective layers constituting the semiconductor substrate SUB are all formed as semiconductor regions containing an n-type or a p-type conductive impurity. Meanwhile, the above-described respective regions (the p-type impurity region PSB, the p-type epitaxial layer PE1, the n-type buried layer NBL, and the p-type epitaxial layer PE2) are formed on an entire surface of the semiconductor substrate SUB in a plan view. However, the entire surface here means an entire region in a plan view of the semiconductor substrate SUB excluding a region where the element isolation region DTR, the substrate contact SCN, and the like are formed.

Both of an n-type transistor and a p-type transistor may be formed in the CMOS transistor region as the logic portion LG, and the high-voltage MOS transistor region as the output driver portion HV. For this reason, as shown in FIG. 3, a high-voltage n-type well region HNW may be formed in a region where the p-type epitaxial layer PE2 is formed, or for example, a p-type well region, which is not shown, may be formed instead of the high-voltage n-type well region HNW. Alternatively, both of the n-type well region and the p-type well region may be formed.

The element isolation region DTR that surrounds the CMOS transistor region as the logic portion LG and the high-voltage MOS transistor region as the output driver portion HV has a configuration in which an insulating film II1 and a hollow AG have been formed inside a concave portion TI. Specifically, the concave portion TI is formed so as to extend inside the semiconductor substrate SUB from the main surface (main surface on a side opposite to a main surface in contact with the n-type buried layer NBL of the p-type epitaxial layer PE2) of the semiconductor substrate SUB, and to extend in a direction (direction where the epitaxial layer PE1 and the like are stacked) vertical to the main surface of the semiconductor substrate SUB. The insulating film II1 is formed on a side wall and a bottom wall of the concave portion TI, and the hollow AG as a void (bubble) in which the insulating film II1 is not arranged is formed in a region surrounded by the insulating film II1 in the concave portion TI.

The substrate contact SCN of the substrate electrode region has a configuration in which the insulating film II1 and the substrate contact conductive layer CDL have been formed inside the concave portion TI. Specifically, the insulating film II1 is formed over the side wall of the concave portion TI, and the region surrounded by the insulating film II1 in the concave portion TI is filled with the substrate contact conductive layer CDL. The substrate contact conductive layer CDL extends along a direction where the concave portion TI extends, and is formed so as to reach the bottom wall of the concave portion TI.

The insulating film II1 is formed so as to cover an upper surface of the interlayer insulating film II that covers a region other than a region where the element isolation region DTR, the substrate contact SCN, and a plug conductive layer PL1 (in the CMOS transistor region, and the like) are formed, in the main surface of the semiconductor substrate SUB (p-type epitaxial layer PE2). This insulating film II1 is formed so as to continue from a region over the upper surface of the interlayer insulating film II even to an inside of the concave portion TI. Here, the inside of the concave portion TI means portions over the side wall and the bottom wall of the concave portion TI constituting the element isolation region DTR, and the side wall of the concave portion TI constituting the substrate contact SCN.

Inside the semiconductor substrate SUB, the concave portions TI of the element isolation region DTR and the substrate contact SCN are formed so as to penetrate through the p-type epitaxial layer PE2, the n-type buried layer NBL, and the p-type epitaxial layer PE1 and to reach an inside of the p-type impurity region PSB, from one main surface of the p-type epitaxial layer PE2. However, the concave portion TI is not limited to such an aspect, and, for example, it may have an aspect of penetrating through the p-type epitaxial layer PE2, the n-type buried layer NBL, and the p-type epitaxial layer PE1 to thereby extend an lowermost part of the p-type epitaxial layer PE1 (so as not enter the inside of the p-type impurity region PSB). However, the concave portion TI is preferably formed so as to penetrate through the n-type buried layer NBL to reach the p-type impurity region PSB.

Meanwhile, as will be mentioned later, a wiring layer ICL1 is formed so as to cover the substrate contact conductive layer CDL of the substrate contact SON and the plug conductive layer PL1, and to be electrically coupled to these.

Next, by using FIG. 4, configurations of the CMOS transistor region and the high-voltage MOS transistor region of FIG. 3 will be explained in more detail.

Figure 4:
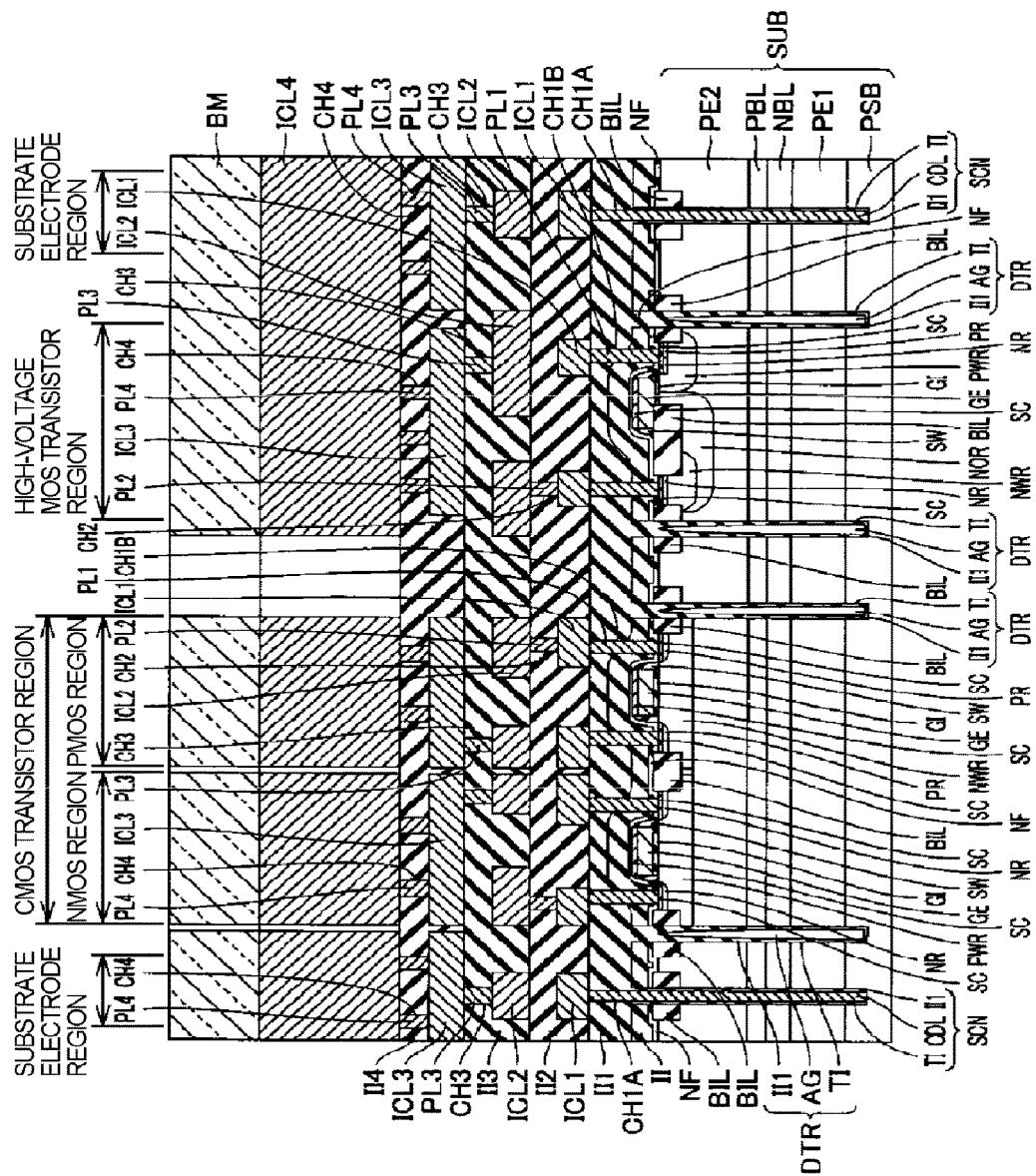
FIG. 4 is a schematic cross-sectional diagram showing in detail aspects of an element or the like formed in each region of FIG. 3.

Referring to FIG. 4, the semiconductor substrate SUB included in the semiconductor chip CHP is formed by: the p-type impurity region PSB; the p-type epitaxial layer PE1; the n-type buried layer NBL; and the p-type epitaxial layer PE2 (as described above), and these are all semiconductor region containing a conductive impurity. Namely, the semiconductor substrate SUB includes only the semiconductor regions.

Here, the semiconductor substrate SUB "including only the semiconductor regions" means a bulk semiconductor substrate, and a substrate such as an SOI (Silicon on Insulator) substrate in which an insulating film is sandwiched therebetween, is not included. However, a device isolation insulating film such as LOCOS (Local Oxidation of Silicon) and STI (Shallow Trench Isolation) may be formed on this "semiconductor substrate".

Accordingly, the concave portions TI of the element isolation region DTR and the like are formed without penetrating through a region having an insulating property. However, as will be mentioned later, the semiconductor substrate SUB may further include a p-type buried layer.

For example, a CMOS transistor is formed in a CMOS transistor region, and this CMOS transistor has a configuration in which an NMOS transistor on a left side and a PMOS transistor on a right side in FIG. 4 have been combined with each other. Namely, the CMOS transistor region has an NMOS region where the NMOS transistor is formed, and a PMOS region where the PMOS transistor is formed, and the NMOS transistor is formed in the NMOS region and the PMOS transistor is formed in the PMOS region, respectively. Meanwhile, here, among CMOS transistors used as logic circuits, the NMOS transistor and the PMOS transistor which are used as an input/output circuit (I/O circuit) electrically coupled to the other semiconductor device are shown as one example.

The NMOS transistor mainly has: a p-type well region PWR formed at the p-type epitaxial layer PE2; an $n^+$ region NR (a conductive region) as a source region or a drain region; a gate insulating film GI; a gate electrode layer GE; and a side wall insulating film SW. The PMOS transistor mainly has: an n-type well region NWR formed at the p-type epitaxial layer PE2; a $p^+$ region PR (conductive region) as the source region or the drain region; the gate insulating film GI; the gate electrode layer GE; and the side wall insulating film SW.

In the high-voltage MOS transistor region, there is formed a high-voltage MOS transistor that can withstand the use under a high-voltage. This high-voltage MOS transistor mainly has: the n-type well region NWR; an n-type offset region NOR; the p-type well region PWR; the $n^+$ region NR and the $p^+$ region PR (conductive regions) as the source region or the drain region; the gate insulating film GI; the gate electrode layer GE; and the side wall insulating film SW. As described above, elements such as the NMOS transistor are formed so as to have a conductive region at the main surface of the semiconductor substrate SUB.

Meanwhile, although, in FIG. 4, the p-type well region PWR and the n-type well region NWR which constitute the CMOS transistor and the high-voltage MOS transistor are formed at the p-type epitaxial layer PE2, they may be formed at the high-voltage n-type well region HNW shown in FIG. 3. In addition, although in the present embodiment, a cobalt silicide layer SC is preferably formed over the respective surfaces of the $n^+$ region NR, the $p^+$ region PR, and the gate electrode layer GE, the cobalt silicide layer SC may be omitted. Furthermore, although it is preferable that a nitride film NF is further formed over the cobalt silicide layer SC of the gate electrode layer GE, or the like, this nitride film NF may also be omitted.

In order to electrically separate a set of the NMOS transistor and the PMOS transistor as the CMOS transistor formed in the CMOS transistor region of FIG. 4, a buried insulating film BIL is formed on the main surface of the semiconductor substrate SUB between the NMOS transistor and the PMOS transistor. The buried insulating film BIL has a configuration in which the inside of the concave portion selectively formed in the main surface of the semiconductor substrate SUB has been filled with the insulating film (for example, a silicon oxidation film).

A similar buried insulating film BIL is formed also in some regions of the high-voltage MOS transistor. In addition, the element isolation region DTR that planarly surrounds the CMOS transistor (region) and the high-voltage MOS transistor (region) from the outside penetrates through the buried insulating film BIL formed on the main surface of the semiconductor substrate SUB in order to electrically separate the CMOS transistor (region) and the high-voltage MOS transistor (region) from their outside regions, and the element isolation region DTR divides the buried insulating film BIL into two left and right parts. Furthermore, the substrate contact SCN also penetrates through the buried insulating film BIL formed on the main surface of the semiconductor substrate SUB, and divides the buried insulating film BIL into two left and right parts.

For example, an interlayer insulating film II including the silicon oxidation film is formed over the main surface of the semiconductor substrate SUB (p-type epitaxial layer PE2) on which the element isolation region DTR is formed, so as to cover the CMOS transistor and the high-voltage MOS transistor. For example, an interlayer insulating film II1 (insulating film) including the silicon oxidation film is formed so as to cover an upper surface of the interlayer insulating film II. This interlayer insulating film II1 is formed so as to cover the CMOS transistor and the high-voltage MOS transistor (element) in the same way as the interlayer insulating film II, and is formed so as to cover also a side wall and a bottom wall of the element isolation region DTR formed on the main surface of the semiconductor substrate SUB in the outside in the plan view of the CMOS transistor region and the high-voltage MOS transistor region.

The concave portion TI formed so as to extend to the inside from the main surface of the semiconductor substrate SUB has: a first concave portion TI constituting the substrate contact SCN in the substrate electrode region; and a second concave portion TI constituting the element isolation region DTR that is formed so as to surround, from the outside, the CMOS transistor region and the high-voltage MOS transistor region in the plan view, the second concave portion TI being different from the first concave portion. Both the first and second concave portions TI are formed so as to extend to the inside from the main surface of the semiconductor substrate SUB.

The interlayer insulating film II1 formed over the main surface of the semiconductor substrate SUB is formed so as to fill a part of the inside of the concave portion TI constituting the element isolation region DTR formed on the main surface of the semiconductor substrate SUB. However, the interlayer insulating film II1 does not completely fill the inside of the concave portion TI constituting the element isolation region DTR, but partially fills it. For this reason, the capped hollow AG is formed inside the concave portion TI constituting the element isolation region DTR. As a result, in the element isolation region DTR, particularly the side wall and the bottom wall inside the concave portion TI are formed so as to be covered by the interlayer insulating film II1. The interlayer insulating film II1 preferably covers the entire side wall and bottom wall of the concave portion TI constituting the element isolation region DTR.

The hollow AG in the element isolation region DTR extends along a direction (vertical direction of FIG. 4) where the concave portion TI extends, and has a length shorter than a length (in the vertical direction of FIG. 4) of the concave portion TI and a width narrower than a width (in a horizontal direction of FIG. 4) of the concave portion TI. However, the hollow AG preferably has a length comparatively close to the length of the concave portion TI in relation to the vertical direction of FIG. 4. In other words, the hollow AG preferably extends from a region near the main surface of the semiconductor substrate SUB (p-type epitaxial layer PE2) to a region near the bottom wall of the concave portion TI.

In addition, the hollow AG is preferably formed so that a width of an upper part is narrower than that of a lower part in FIG. 4. That is, although, in FIG. 3, the hollow AG entirely is illustrated so as to have a substantially constant width, actually, the hollow AG preferably has a tapered shape as shown in FIG. 4. An upper end of the hollow AG having the tapered shape is capped, and the hollow AG is formed as a bubble whose periphery is surrounded by the interlayer insulating film II1.

Also in the substrate contact SCN of the substrate electrode region, in the same way as the element isolation region DTR, the concave portion TI is formed so as to extend in the vertical direction of FIG. 4 from one main surface (main surface in contact with the interlayer insulating film II1) of the semiconductor substrate SUB to the approximately same depth (for example, in the p-type impurity region PSB) as the bottom surface of the concave portion TI of the element isolation region DTR.

The interlayer insulating film II1 formed over the main surface of the semiconductor substrate SUB is formed so as to fill a part of an inside of the first concave portion TI constituting the substrate contact SCN formed on the main surface of the semiconductor substrate SUB. Although this interlayer insulating film II1 is formed so as to cover a side wall of the first concave portion TI, the interlayer insulating film II1 is formed so as to expose the semiconductor substrate SUB on the bottom wall of the concave portion TI without covering at least a part (for example, a central part) of the bottom wall thereof. The interlayer insulating film II1 preferably covers an entire side wall of the first concave portion TI constituting the substrate contact SCN.

The substrate contact conductive layer CDL as a first conductive layer that extends in the direction (vertical direction of FIG. 4) in which the concave portion TI extends inside the first concave portion TI of the substrate contact SCN (for example, a central part surrounded by the insulating film II1 in the concave portion TI) is formed so as to reach the bottom wall of the concave portion TI from one main surface (main surface on an opposite side of the main surface in contact with the semiconductor substrate SUB) of the interlayer insulating film II1. In other words, the substrate contact conductive layer CDL of the substrate contact SCN is formed so as to fill an inside of the hollow AG similar to a contact hole CH1A formed in some regions in the interlayer insulating film II1 and the concave portion TI, and the above-described element isolation region DTR.

In addition, the wiring layer ICL1 is formed over one main surface of the interlayer insulating film II1 in which the first concave portion TI of the substrate contact SCN is formed, and this wiring layer ICL1 is formed so as to cover the substrate contact conductive layer CDL of the substrate contact SCN. Accordingly, the substrate contact conductive layer CDL of the substrate contact SCN is electrically coupled to both of the wiring layer ICL1 and the semiconductor substrate SUB (p-type impurity region PSB).

The wiring layer ICL1 is formed not only in a region right over the substrate contact conductive layer CDL of the substrate contact SCN, but also in regions right over regions NR and PR as the source/drain regions (conductive portions) of the CMOS transistor and the high-voltage MOS transistor, over one main surface of the interlayer insulating film II1. Between the above-described regions NR and PR, and the wiring layer ICL1 formed right over the regions, there is formed the plug conductive layer PL1 that extends so as to penetrate through the interlayer insulating film II and the interlayer insulating film II1 in the vertical direction of FIG. 4.

Meanwhile, the plug conductive layer PL1 as a second conductive layer is formed so as to fill an inside of a contact hole CH1B that has been formed so as to reach the regions NR and PR of the CMOS transistor and the high-voltage MOS transistor formed on the other main surface (one main surface of the semiconductor substrate SUB) from one main surface of the interlayer insulating film II1. The plug conductive layer PL1 electrically couples the wiring layer ICL1 located right thereover to the regions NR and PR located right thereunder (elements such as the CMOS transistor).

The contact hole CH1A as a first hole portion extends in the vertical direction of FIG. 4 so as to reach the bottom wall of the concave portion TI through the inside of the first concave portion TI of the substrate electrode region from an upper surface (upper-side surface) of the interlayer insulating film II1, and to lead to the p-type impurity region PSB where the bottom wall of the concave portion TI is arranged. In addition, the contact hole CH1B as a second hole portion is formed so as to reach the source/drain regions (conductive regions) of the CMOS transistor and the like from the upper surface (upper-side surface) of the interlayer insulating film II1.

The substrate contact conductive layer CDL of the substrate contact SCN as the first conductive layer, and the plug conductive layer PL1 as the second conductive layer are formed with the same material.

On an upper side of the wiring layer ICL1 (opposite side of the semiconductor substrate SUB), an interlayer insulating film II2 is formed over the interlayer insulating film II1 so as to cover the wiring layer ICL1. A contact hole CH2 is formed so as to reach an upper surface of the wiring layer ICL1 from one main surface (a side opposite to a side in contact with the interlayer insulating film II1) of the interlayer insulating film II2, and a plug conductive layer PL2 is formed so as to fill an inside of the contact hole CH2. Namely, the plug conductive layer PL2 extends so as to penetrate through the interlayer insulating film II2 in the vertical direction of FIG. 4. Above the plug conductive layer PL2, in the same way as the above, there are formed: interlayer insulating films II3 and II4; contact holes CH3 and CH4; plug conductive layers PL3 and PL4; and wiring layers ICL2, ICL3, and ICL4. Materials or the like of the above are all basically similar to those of the above-described interlayer insulating film II1, contact hole CH1, plug conductive layer PL1, and wiring layer ICL1. Furthermore, a pattern of a glass coating film BM may be formed above the above-described interlayer insulating films II3 and II4, contact holes CH3 and CH4, plug conductive layers PL3 and PL4, and wiring layers ICL2, ICL3, and ICL4.

Next, using FIGS. 5 to 15, there will be explained a method for manufacturing the semiconductor chip CHP having the CMOS transistor region, the high-voltage MOS transistor region, and the substrate electrode region which are shown in FIG. 4 as the semiconductor device of one embodiment. Meanwhile, FIGS. 5 to 15 show a manufacturing method of a configuration shown in FIG. 4 for each process, and each region shown in FIGS. 5 to 15 is basically the same as each region shown in FIG. 4.

Figure 5:
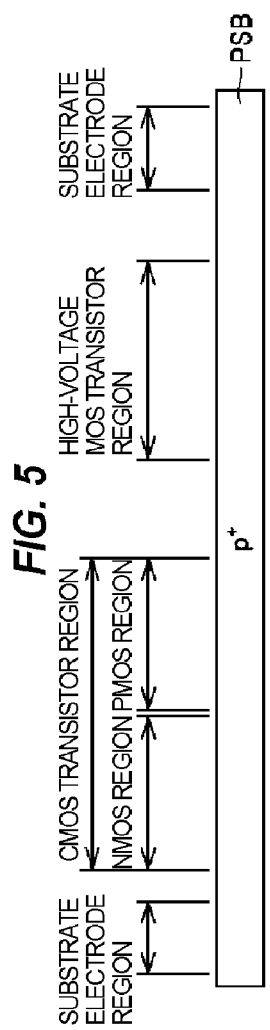
FIG. 5 is a schematic cross-sectional diagram showing a first process of a method for manufacturing the semiconductor device in the First Embodiment.

Referring to FIG. 5, as a semiconductor substrate, first, there is prepared the p-type impurity region PSB including a p-type impurity region ($p^+$ region as a first conductive-type substrate region) having a comparatively high concentration.

Figure 6:
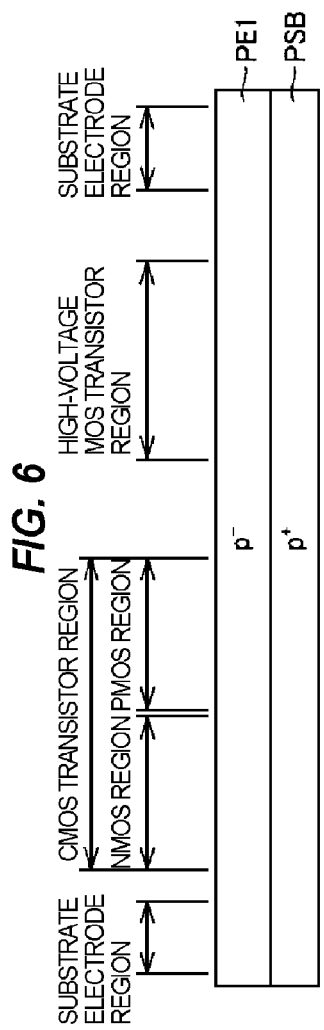
FIG. 6 is a schematic cross-sectional diagram showing a second process of the method for manufacturing the semiconductor device in the First Embodiment.

Referring to FIG. 6, the p-type epitaxial layer PE1 having a comparatively lower p-type impurity concentration than the p-type impurity region PSB is formed over one main surface (for example, an upper-side main surface) of the p-type impurity region PSB by using a usual epitaxial technology.

Figure 7:
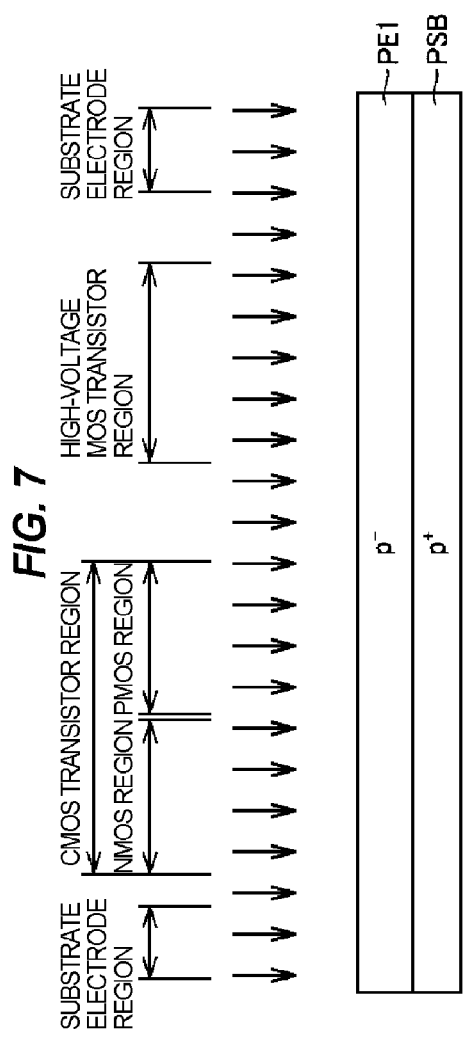
FIG. 7 is a schematic cross-sectional diagram showing a third process of the method for manufacturing the semiconductor device in the First Embodiment.

Referring to FIG. 7, an n-type impurity is implanted inside the p-type epitaxial layer PE1 as shown by arrows in FIG. 7 by using a usual ion implantation technology. Consequently, referring to FIG. 8, the n-type buried layer NBL as an n-type (second conductive-type) diffusion layer is formed on the entire surface of the p-type epitaxial layer PE1 closer to the main surface (an upper side in FIG. 7) than the p-type impurity region PSB.

Figure 8:
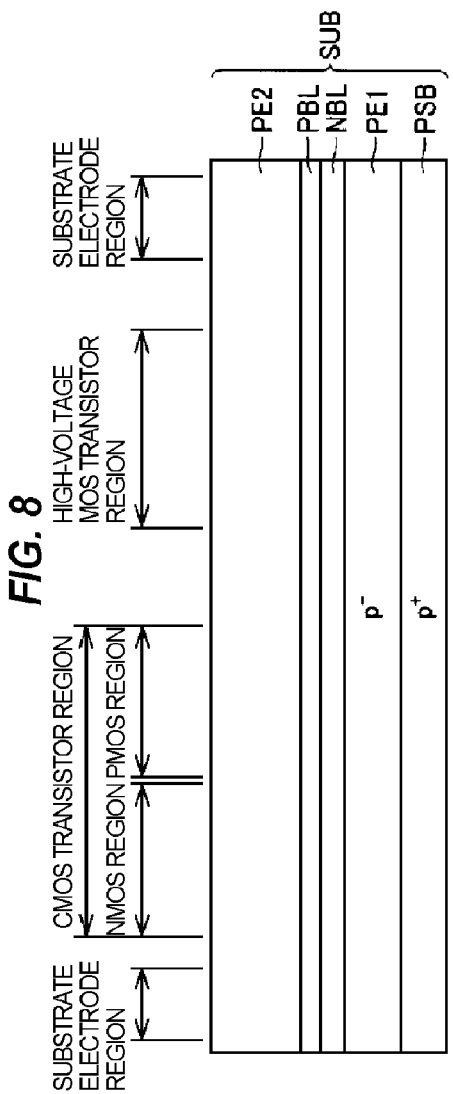
FIG. 8 is a schematic cross-sectional diagram showing a fourth process of the method for manufacturing the semiconductor device in the First Embodiment.

Furthermore, referring to FIG. 8, a p-type impurity is implanted inside the n-type buried layer NBL by using the usual ion implantation technology, and thus a p-type buried layer PBL as a p-type diffusion layer may be formed on the entire surface of the main surface of the n-type buried layer NBL. The p-type epitaxial layer PE2 having a comparatively lower p-type impurity concentration than the p-type impurity region PSB is further formed over the p-type buried layer PBL by using a usual epitaxial technology.

As described above, in the entire surface in the plan view, there is formed the semiconductor substrate SUB having thereinside the p-type impurity region PSB, the p-type epitaxial layer PE1, the n-type buried layer NBL, the p-type buried layer PBL, and the p-type epitaxial layer PE2.

Figure 9:
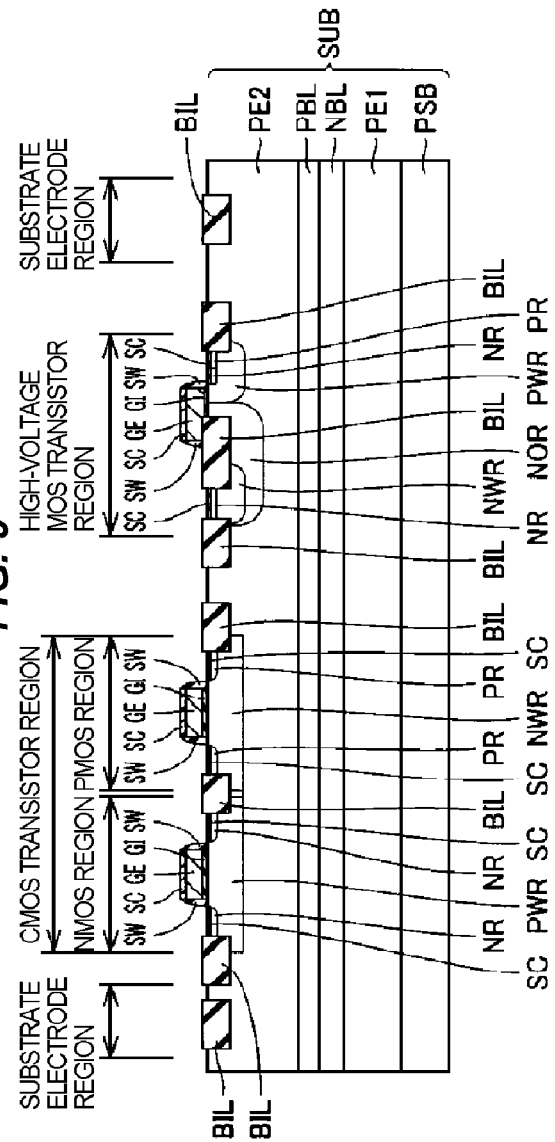
FIG. 9 is a schematic cross-sectional diagram showing a fifth process of the method for manufacturing the semiconductor device in the First Embodiment.

Referring to FIG. 9, elements such as the CMOS transistor and the MOS transistor are formed at predetermined positions of the main surface (upper-side main surface in FIG. 9) of the semiconductor substrate SUB formed in each process of FIGS. 5 to 8.

Specifically, at the p-type epitaxial layer PE2 (or at the high-voltage n-type well region HNW shown in FIG. 3), the NMOS transistor is formed in the NMOS region of the CMOS transistor region, and the PMOS transistor is formed in the PMOS region thereof. The NMOS transistor mainly has: the p-type well region PWR formed at the p-type epitaxial layer PE2; the $n^+$ region NR as the source region or the drain region (conductive portions); the gate insulating film GI; the gate electrode layer GE; and the side wall insulating film SW. The PMOS transistor mainly has: the n-type well region NWR formed at the p-type epitaxial layer PE2; the p+ region PR as the source region or the drain region; the gate insulating film GI; the gate electrode layer GE; and the side wall insulating film SW.

In addition, the high-voltage MOS transistor is formed at the p-type epitaxial layer PE2 (or the high-voltage n-type well region HNW shown in FIG. 3) in the high-voltage MOS transistor region. The high-voltage MOS transistor mainly has: the n-type well region NWR; the n-type offset, region NOR; the p-type well region PWR; the n+ region NR; the p+ region PR; the gate insulating film GI; the gate electrode layer GE; and the side wall insulating film SW.

The above-described CMOS transistor and MOS transistor may include the cobalt silicide layer SC. In addition, the buried insulating film BIL is formed in a region that planarly surrounds the above-described each element from the outside, the substrate electrode region, and a region between the NMOS transistor and the PMOS transistor.

Figure 10:
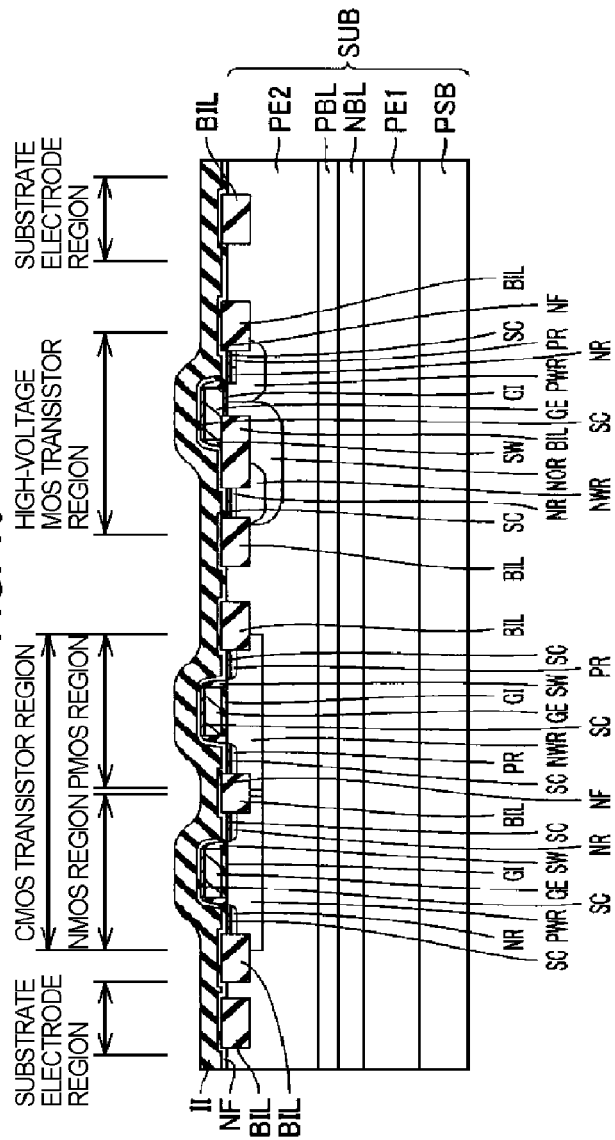
FIG. 10 is a schematic cross-sectional diagram showing a sixth process of the method for manufacturing the semiconductor device in the First Embodiment.

Referring to FIG. 10, the nitride film NF (refer to FIG. 4) may be included so as to cover the formed CMOS transistor and the high-voltage MOS transistor. In addition, the interlayer insulating film II including the silicon oxidation film is formed over the semiconductor substrate SUB, for example, by using a CVD (Chemical Vapor Deposition) method.

Figure 11:
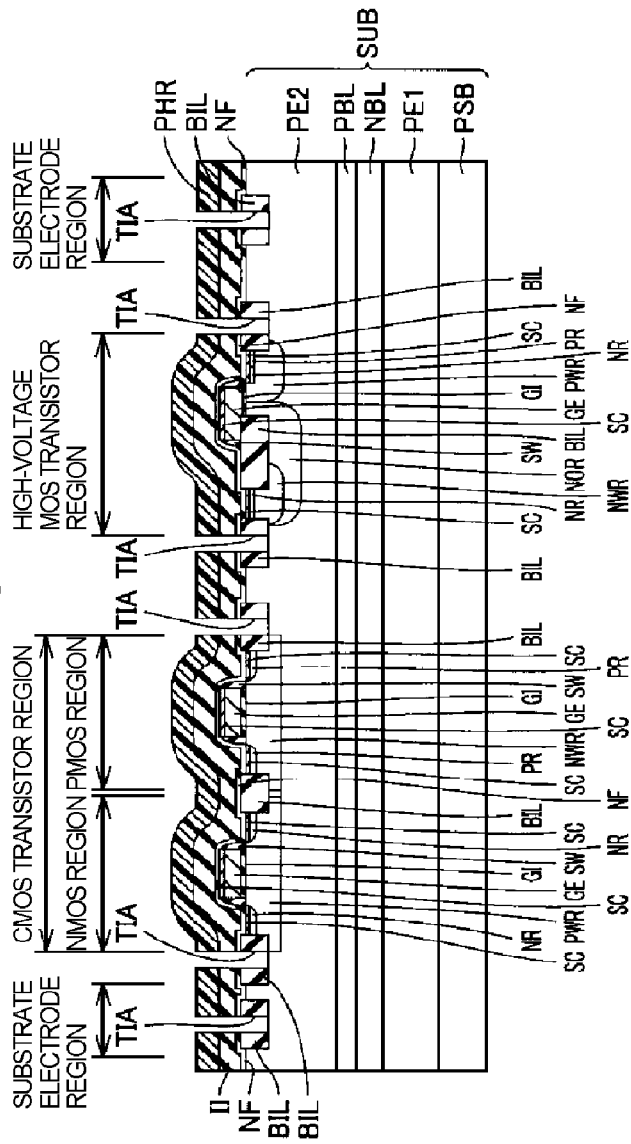
FIG. 11 is a schematic cross-sectional diagram showing a seventh process of the method for manufacturing the semiconductor device in the First Embodiment.

Referring to FIG. 11, a photoresist PHR is coated so as to cover the interlayer insulating film II. This photoresist PHR is patterned by a usual photolithography technology. Anisotropic etching of the interlayer insulating film II and the buried insulating film BIL is performed in order using this patterned photoresist PHR as a mask. Consequently, there is formed a through-concave portion TIA that passes through the interlayer insulating film II and the buried insulating film BIL. After this, the photoresist PHR is removed by ashing or the like.

Figure 12:
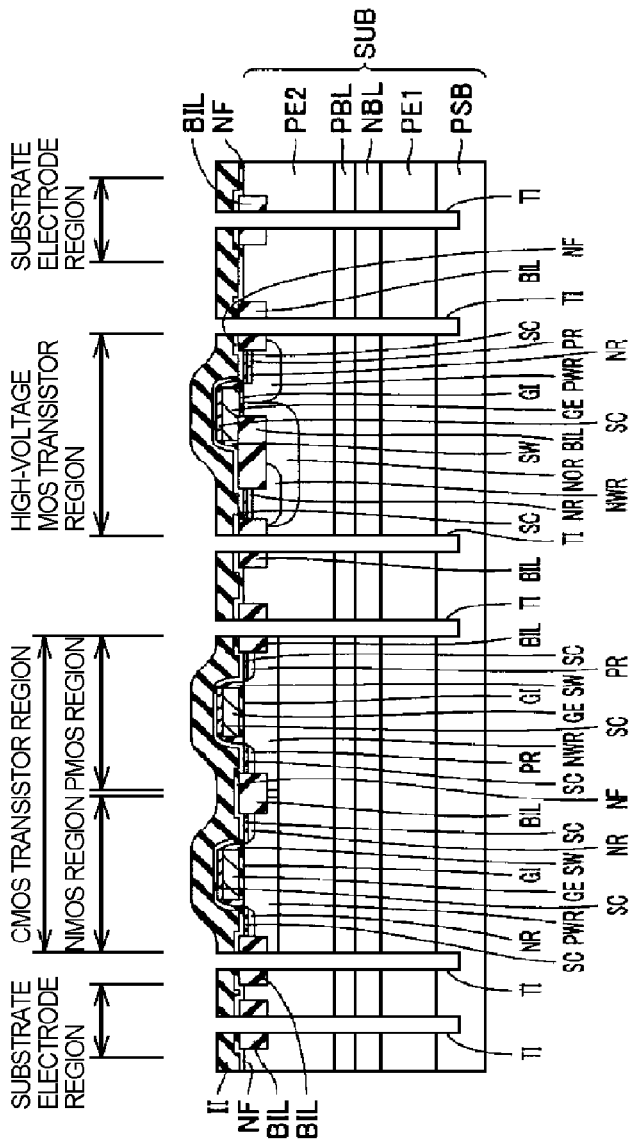
FIG. 12 is a schematic cross-sectional diagram showing an eighth process of the method for manufacturing the semiconductor device in the First Embodiment.

Referring to FIG. 12, anisotropic etching is applied to the p-type epitaxial layer PE2 using the interlayer insulating film II as a mask. Consequently, the semiconductor substrate SUB (p-type epitaxial layer PE2) directly under the through-concave portion TIA is selectively removed. Consequently, the concave portion TI is formed, for example, so as to penetrate through the p-type epitaxial layer PE2, the p-type buried layer PBL, the n-type buried layer NBL, and the p-type epitaxial layer PE1 to thereby reach the p-type impurity region PSB from the surface of the semiconductor substrate SUB (p-type epitaxial layer PE2). This concave portion TI is preferably formed so as to penetrate through the n-type buried layer NBL to thereby reach the p-type impurity region PSB.

In the manner as described above, the concave portion TI is formed that extends the inside of the semiconductor substrate SUB from the main surface of the semiconductor substrate SUB, the concave portion TI eventually serving as the first concave portion and the second concave portion. That is, in other words, the first concave portion TI and the second concave portion TI are simultaneously formed by the same etching treatment.

Figure 13:
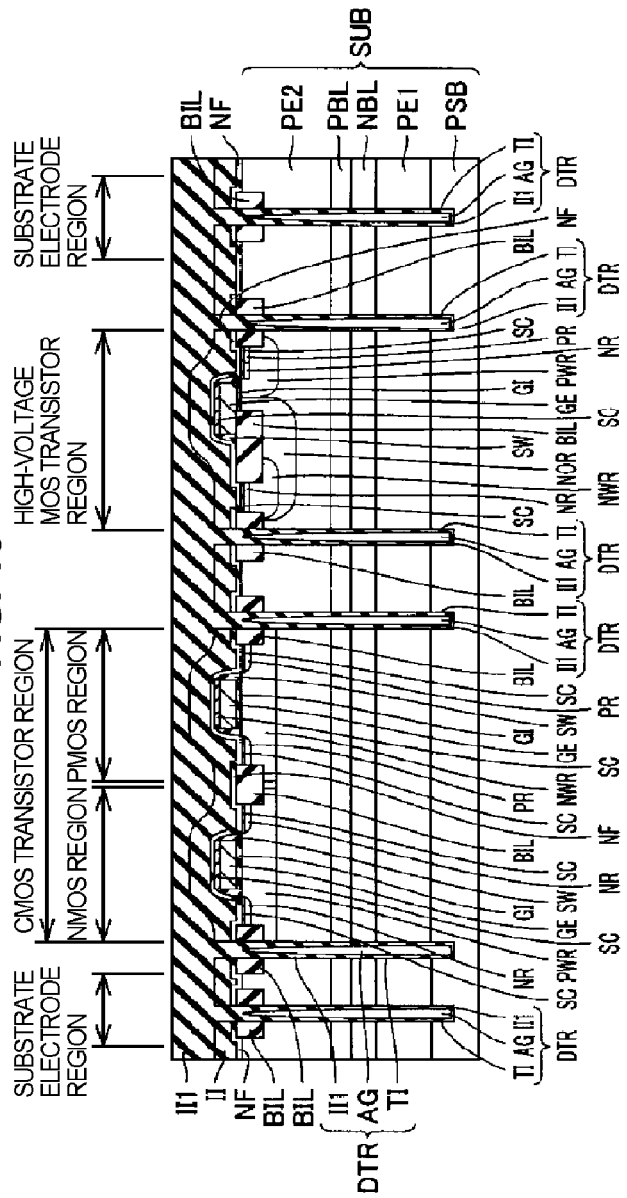
FIG. 13 is a schematic cross-sectional diagram showing a ninth process of the method for manufacturing the semiconductor device in the First Embodiment.

Referring to FIG. 13, the insulating film II1 (insulating film) is formed over each element and in the concave portion TI so as to cover the interlayer insulating film II over each element and a surface of the p-type epitaxial layer PE2 of the substrate electrode region, and to form the capped hollow AG in the concave portion TI. Specifically, the interlayer insulating film II1 is formed over the main surface of the semiconductor substrate SUB, the side wall and the bottom wall of the concave portion TI. Here, since an aspect ratio of the concave portion TI is high, and the (interlayer) insulating film II1 is difficult to fill an entire inside of the concave portion TI, the insulating film II1 is not supplied to a center of the concave portion TI particularly excluding the side wall and the bottom wall thereof, and as a result, the bubble-like hollow AG is formed.

The above-described insulating film II1 is, for example, formed of BP-TEOS with a thickness of 1320 nm, and a usual silicon oxidation film. The upper surface of this insulating film II1 is polished and removed by a CMP (Chemical Mechanical Polishing) method. However, the insulating film II1 is not limited to an insulating film (BP-TEOS) containing a conductive impurity as described above, it may be, for example, the usual silicon oxidation film not containing the conductive impurity.

Here, the hollow AG formed in the concave portion TI preferably has a length (comparatively) near a length of the concave portion TI in relation to the vertical direction of FIG. 13, i.e., has substantially the same length (in the vertical direction of FIG. 13) as the concave portion TI. Namely, the hollow AG preferably extends from the region near the main surface of the semiconductor substrate SUB (p-type epitaxial layer PE2) to the region near the bottom wall of the concave portion TI. In addition, the hollow AG is formed so that a width is narrower in the upper side (side near the main surface of the semiconductor substrate SUB) of the concave portion TI of FIG. 13 than in the lower side (side near the bottom wall of the concave portion TI) thereof. In other words, a thickness of the insulating film II1 (interlayer insulating film II1) formed over the side wall of the concave portion TI becomes thicker in the upper side of the concave portion TI than in the lower side thereof.

As described above, in a process of FIG. 13, the insulating film II1 is eventually formed over the side walls and the bottom walls of both the concave portion TI serving as the first concave portion TI, and the concave portion TI serving as the second concave portion TI.

Figure 14:
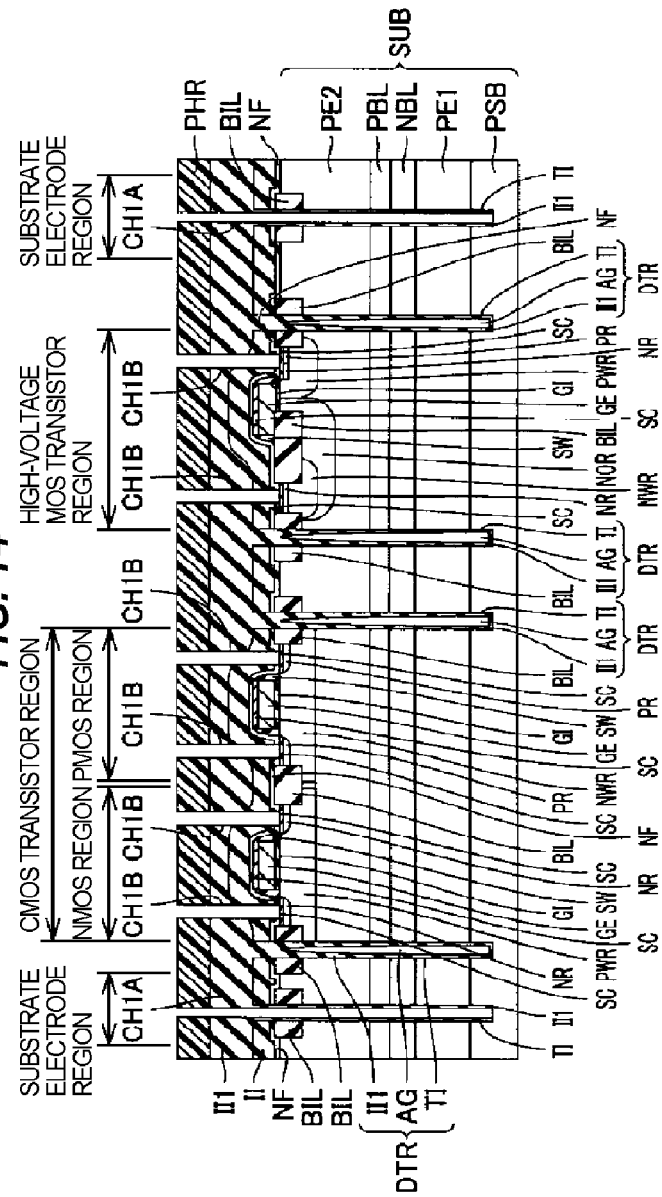
FIG. 14 is a schematic cross-sectional diagram showing a tenth process of the method for manufacturing the semiconductor device in the First Embodiment.

Referring to FIG. 14, the photoresist PHR is coated so as to cover the interlayer insulating film II1. The usual photolithography technique is performed on this photoresist PHR, and thus patterning is performed so that an opening is formed right over the conductive portions (source/drain regions) of the CMOS transistor and the high-voltage MOS transistor, and right over the inside of the concave portion TI in the substrate electrode region. Anisotropic etching of the interlayer insulating film II1 is performed by using this patterned photoresist PHR as a mask.

Consequently, in the CMOS transistor region and the high-voltage MOS transistor region, the contact hole CH1B as the second hole portion is formed so as to reach the conductive portions (source/drain regions) of the CMOS transistor and the high-voltage MOS transistor from an uppermost surface of the interlayer insulating film II1. In addition, at this time, in the substrate electrode region, the contact hole CH1A as the first hole portion is formed so as to reach the inside of the concave portion TI, particularly, the hollow AG in the concave portion TI.

The contact hole CH1A formed here has an aspect in which a portion formed by etching treatment in the same way as the contact hole CH1B, and the originally existing hollow AG have been coupled to be integrated. After the contact hole CH1A is integrated with the hollow AG, there is etched the insulating film II1 formed over the bottom wall of the concave portion TI existing right under the hollow AG, and the contact hole CH1A is formed so as to reach the bottom wall (p-type impurity region PSB) of the concave portion TI from the bottom wall of the hollow AG, and to eventually expose the semiconductor substrate SUB (p-type impurity region PSB) on the bottom wall of the concave portion TI. More specifically, as to the contact hole CH1A, the interlayer insulating film II1 is first etched so that the interlayer insulating film II1 reaches the hollow AG in the concave portion TI from the upper surface of the interlayer insulating film II1 toward the lower side of FIG. 14. At this time, the etching is performed so as to reach the semiconductor substrate SUB (for example, the p-type impurity region PSB) on the bottom wall of the concave portion TI while leaving the insulating film II1 over the side wall of the concave portion TI, in other words, so as to remove the insulating film II1 over the bottom wall of the concave portion TI (sandwiched between the bottom wall of the concave portion TI and the bottom wall of the hollow AG).

On the other hand, the contact hole CH1B is formed by the same etching treatment as etching the interlayer insulating film II1 in a lower direction of FIG. 14 in order to form the contact hole CH1A (before reaching the hollow AG). Namely, the contact hole CH1B is formed so as to reach the conductive portions (source/drain regions and the like) of the element from the upper surface of the interlayer insulating film II1.

The contact hole CH1A and the contact hole CH1B are formed by the same etching treatment. As described above, the hollow AG as the bubble in which the insulating film II1 formed in the concave portion TI and so forth are not arranged is formed so as to extend to an uppermost portion of the concave portion TI, that is, to the vicinity of the main surface of the semiconductor substrate SUB (p-type epitaxial layer PE2). For this reason, there is no large difference between a distance of the regions NR, PR and the like as the conductive portions the contact hole CH1B should reach, from the upper-side surface of the interlayer insulating film II1, and a distance of the hollow AG that the contact hole CH1A should reach therefrom.

Accordingly, there is no large difference between a depth into which the interlayer insulating film II1 should be etched in order to form the contact hole CH1A, and a depth into which the interlayer insulating film II1 should be etched in order to form the contact hole CH1B. For this reason, it becomes possible to form the contact hole CH1A and the contact hole CH1B which completely differ in depth at a glance, by the same etching treatment.

The contact hole CH1A in the concave portion TI of the substrate electrode region is integrated with the hollow AG by the above-described etching treatment, and subsequently, further the insulating film II1 over the bottom wall of the concave portion TI existing right under the hollow AG is removed. For this reason, the contact hole CH1A is formed so as to reach the bottom wall of the concave portion TI from the upper-side surface of the interlayer insulating film II1.

Widths (in a horizontal direction of FIG. 14) of the contact hole CH1A and the contact hole CH1B are preferably narrower than the width (in the horizontal direction of FIG. 14) of the concave portion TI for forming the element isolation region DTR. According to the above-described configuration, the contact hole CH1A can be formed so as to reach the bottom wall of the concave portion TI through the inside of the concave portion TI. In addition, from the point of view that the contact hole CH1A and the contact hole CH1B are formed by the same etching treatment, the widths (in the horizontal direction of FIG. 14) of the both are preferably equal to each other.

As one example, it is preferable that the widths of the contact hole CH1A and the contact hole CH1B are set to be 0.4 μm, and that the width of the concave portion TI for forming the element isolation region DTR (and the substrate contact SCN) is set to be 0.8 μm. When the element isolation region DTR is formed very deep, the width of the concave portion TI for forming the element isolation region DTR (and the substrate contact SCN) needs to be set wide, but when the above-described depth is approximately 20 μm or less, the width of the concave portion TI can be set to be 0.8 μm.

Figure 15:
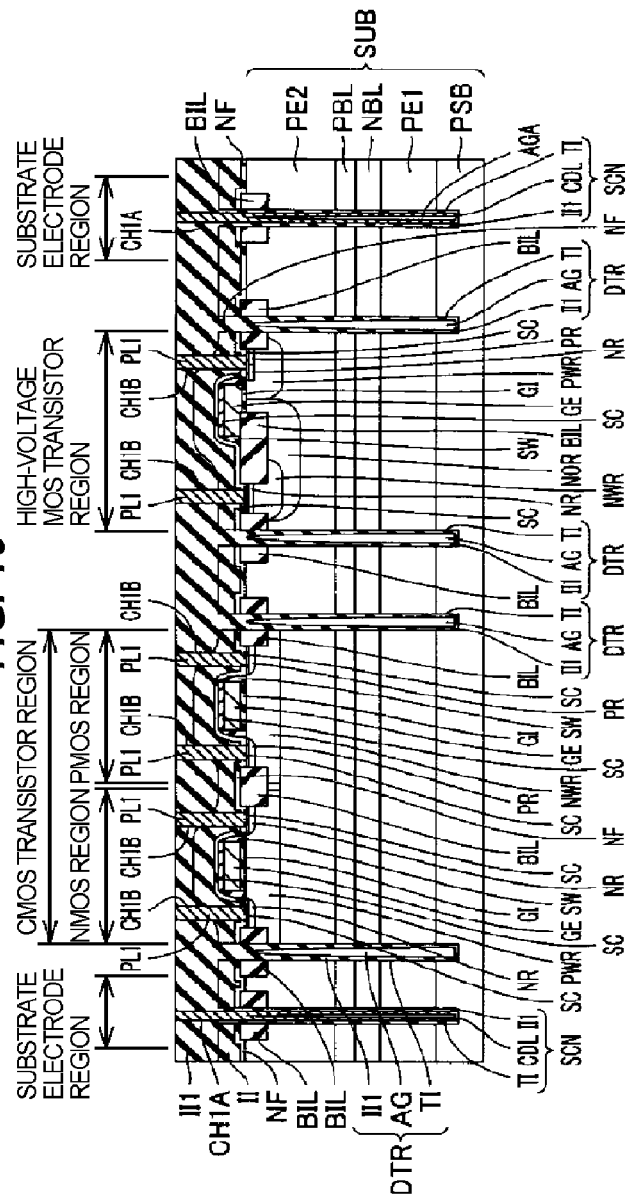
FIG. 15 is a schematic cross-sectional diagram showing an eleventh process of the method for manufacturing the semiconductor device in the First Embodiment.

Referring to FIG. 15, after the photoresist PHR is removed by asking and so forth, thin films of titanium (Ti) and titanium nitride (TiN) are formed as barrier metal so as to cover the interlayer insulating film II1, and wall surfaces inside the contact holes CH1A and CH1B, for example, by a usual sputtering method, and subsequently, a metal thin film of tungsten (W) is formed by a plasma CVD method. Next, the above-described barrier metal and the metal thin film over the interlayer insulating film II1 are removed by etch back.

In this way, the plug conductive layer PL1 including the metal thin film of tungsten is formed inside the contact hole CH1B, and simultaneously, the substrate contact conductive layer CDL including the metal thin film of tungsten is formed inside the contact hole CH1A. Namely, the substrate contact conductive layer CDL and the plug conductive layer PL1 are formed by the same film-forming treatment, and both are formed of the same material. The plug conductive layer PL1 is formed so as to be electrically coupled to the source/drain regions (conductive portions) of the CMOS transistor and the high-voltage MOS transistor. The substrate contact conductive layer CDL is formed so as to be electrically coupled to the semiconductor substrate SUB (for example, the p-type impurity region PSB).

Meanwhile, the substrate contact conductive layer CDL may be formed so that a hollow AGA as a bubble similar to the above-described hollow AG is formed thereinside. However, the hollow AGA is omitted in the following each drawing.

As described above, although the plug conductive layer PL1 and the substrate contact conductive layer CDL may be formed of the metal thin film of tungsten, they may be a metal thin film formed of, for example, aluminum.

Figure 16:
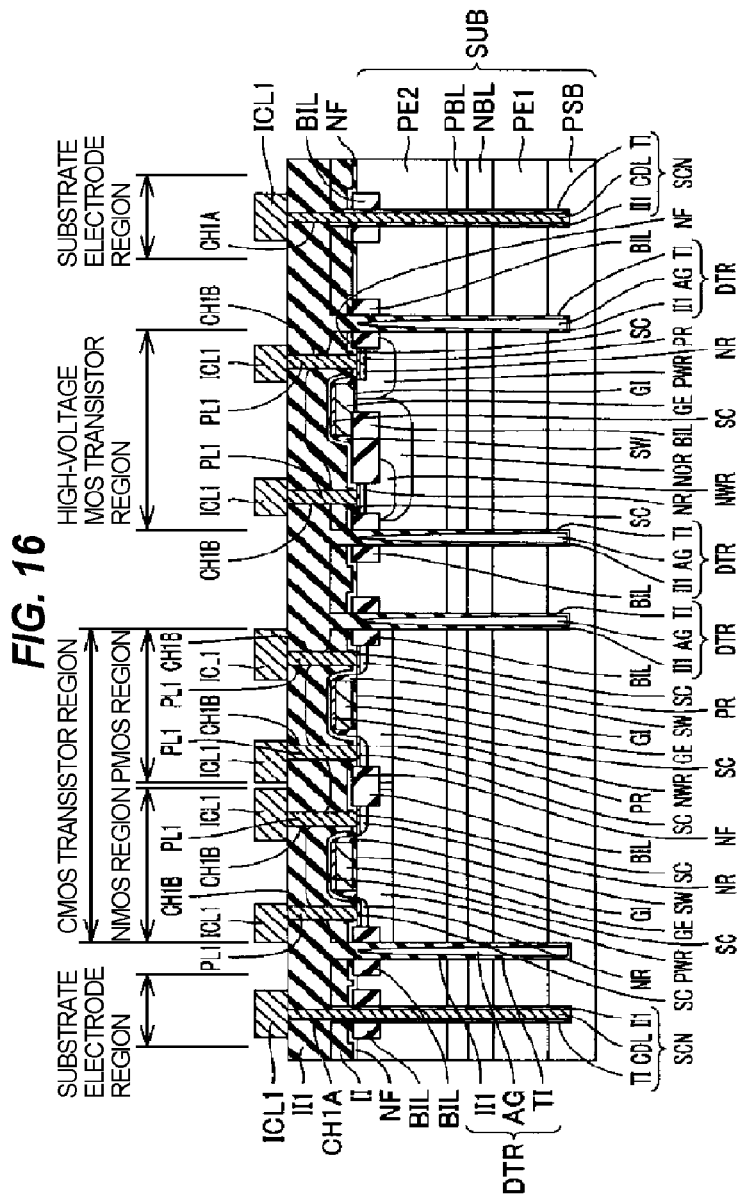
FIG. 16 is a schematic cross-sectional diagram showing a twelfth process of the method for manufacturing the semiconductor device in the First Embodiment.

Referring to FIG. 16, the wiring layer ICL1 is formed over the interlayer insulating film II1 so as to be in contact with upper surfaces of the plug conductive layer PL1 and the substrate contact conductive layer CDL, and to electrically couple these to the conductive portion of each element or the semiconductor substrate SUB (p-type impurity region PSB). Although this wiring layer ICL1 is preferably formed as a stacked structure of titanium nitride, and alloy (AlCu) of copper and aluminum, for example, by the usual sputtering method, it may be formed of the same material as the above-described plug conductive layer PL1 and substrate contact conductive layer CDL. As one example, for example, a stacked structure of titanium nitride of 26.5 nm and AlCu of 450 nm is formed.

As described above, in the substrate electrode region, the substrate contact conductive layer CDL is formed in the contact hole CH1A in the concave portion TI. This substrate contact conductive layer CDL is formed so as to electrically couple the semiconductor substrate SUB (p-type impurity region PSB) to the wiring layer ICL1. In addition, in the CMOS transistor region and the high-voltage MOS transistor region, the plug conductive layer PL1 is formed in the contact hole CH1B, and this plug conductive layer PL1 is formed so as to electrically couple (the conductive portion of) the element, such as the CMOS transistor, to the wiring layer ICL1.

After that, although each layer on the upper side of the wiring layer ICL1 as shown in FIG. 4 is formed by basically repeating formation processes similar to the above-described formation processes of the interlayer insulating film II1, the plug conductive layer PL1, and the wiring layer ICL1, detailed explanation of the processes are omitted.

Next, operational effects of the present embodiment will be explained.

In the present embodiment, by the same etching treatment, formed are the contact hole CH1A as the first hole portion formed in the concave portion TI in order to form the substrate contact SCN (substrate contact conductive layer CDL) in the substrate electrode region, and the contact hole CH1B as the second hole portion formed in the CMOS transistor region and so forth. For this reason, the number of masks needed for the etching treatment and a time required for treatment can be reduced, for example, compared with a case where the contact hole CH1A and the contact hole CH1B are formed by different etching treatment. As a result, cost required for treatment can be significantly reduced.

In the present embodiment, the contact hole CH1A extends in a vertical direction of FIG. 4 so as to reach the bottom wall of the concave portion TI through the first concave portion TI in the substrate electrode region from the upper surface of the interlayer insulating film II1, and to lead to the p-type impurity region PSB where the bottom wall of the concave portion TI is arranged. In addition, the contact hole CH1B is formed so as to reach the source/drain regions (conductive regions) of the CMOS transistor and so forth from the upper surface of interlayer insulating film II1. As a result of this, it can be verified that the contact hole CH1A and the contact hole CH1B are formed by the same etching treatment.

A first reason that can be achieved the process of forming the contact hole CH1A and the contact hole CH1B by the same etching treatment is that the hollow AG that is not filled with the insulating film II1 is formed in the concave portion TI of the substrate electrode region where the contact hole CH1B is formed. Namely, if the hollow AG is not present, a depth (substantially equal to a sum of a thickness of the interlayer insulating film II1 and a depth of the concave portion TI) that should be etched to form the contact hole CH1A becomes extremely large compared with a depth (thickness of the interlayer insulating film II1) that should be etched to form the contact hole CH1B, and thus it becomes difficult to etch both in the same process. Since the aspect ratio of the concave portion TI is extremely high, the interlayer insulating film II1 only partially fills the inside of the concave portion TI, and the hollow AG is formed, etching is substantially sufficient if progressing to an uppermost portion of the hollow AG, in order to form the contact hole CH1A.

A second reason that can be achieved the process of forming the contact hole CH1A and the contact hole CH1B by the same etching treatment is that the contact hole CH1A is formed so as to penetrate through only the semiconductor region of the semiconductor substrate SUB. Namely, if the contact hole CH1A needs to penetrate through the insulating film buried inside a so-called SOI substrate in the contact hole CH1A being formed, the filling insulating film is thick, much time etc. are needed for etching, and thus it becomes difficult to complete etching by the same etching treatment as in the contact hole CH1B. Since the semiconductor substrate SUB used in the present embodiment includes only the semiconductor region having conductivity, and it does not have the buried insulating film as described above, the contact hole CH1A can be easily formed with substantially the same etching amount as in the contact hole CH1B.

Next, in the present embodiment, the first concave portion TI for forming the substrate contact SCN and the second concave portion TI for forming the element isolation region DTR are formed by the same etching treatment as shown in FIGS. 11 and 12. In addition, the insulating film II1 in the concave portion TI for forming the substrate contact SCN, and the insulating film II1 in the concave portion TI for forming the element isolation region DTR are formed by the same film-forming treatment as shown in FIG. 13. As a result, the number of processes, a treatment time, and manufacturing cost can be reduced compared with a case where the above-described two insulating film II1 are formed as separate treatment.

In the present embodiment, the concave portion TI formed for the substrate contact SCN in the substrate electrode region is formed by the same processes as in the concave portion TI that formed for the element isolation region DTR such as the CMOS transistor region. In other words, in the present embodiment, the substrate contact SCN is formed utilizing a part of the concave portion TI essentially formed in order to form the element isolation region DTR. As described above, formation of the contact hole CH1A for forming the substrate contact SCN becomes easier by the presence of the hollow AG compared with a case, supposing that the hollow AG is not present. For this reason, the substrate contact SCN can be formed more easily utilizing the concave portion TI formed in the other process (process of forming the element isolation region DTR) without performing an additional process for forming the substrate contact SCN. Namely, the present embodiment has a practical advantage in a case where there is a request to lead out a potential of a back side of the substrate from the surface of a front side of the semiconductor substrate SUB by using the substrate contact SCN.

Since the hollow AG is formed in the element isolation region DTR, a stress near the concave portion TI of the element isolation region DTR in the semiconductor substrate SUB can be reduced compared with a case, supposing that the hollow AG is not formed.

In addition, the substrate contact conductive layer CDL that fills the inside of the contact hole CH1A, and the plug conductive layer PL1 that fills the inside of the contact hole CH1B are formed as the same material by the same film-forming treatment. Also because of this, the number of processes, the treatment time, and the manufacturing cost can be reduced compared with a case where the substrate contact conductive layer CDL and the plug conductive layer PL1 are formed by different film-forming treatment.

Figure 17:
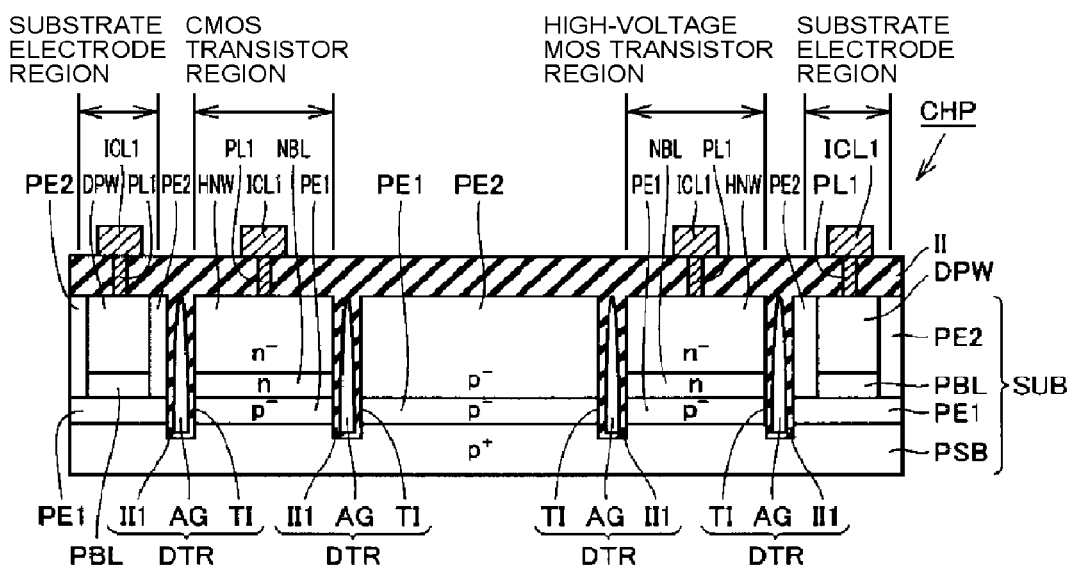
FIG. 17 is a schematic cross-sectional diagram in the portion along the line of FIG. 1 showing a configuration of a semiconductor device in a chip state in a comparative example of the First Embodiment.

Next, referring to FIG. 17, although a semiconductor chip CHP as a comparative example of the present embodiment has a configuration basically similar to the semiconductor chip CHP of the present embodiment of FIG. 3, a configuration of a substrate contact in a substrate electrode region is different from that of the present embodiment. Specifically, the substrate contact is formed of: the p-type buried layer PBL and a deep p-type diffusion layer DPW that have been formed as the same layer as the p-type epitaxial layer PE2. More specifically, in relation to a vertical direction of FIG. 17, the deep p-type diffusion layer DPW, the p-type buried layer PBL, the p-type epitaxial layer PE1, and the p-type impurity region PSB are aligned in that order from a main surface side of the upper side of the semiconductor substrate SUB (p-type epitaxial layer PE2), and these mutually continue in relation to the vertical direction of FIG. 17. Furthermore, in FIG. 17, the interlayer insulating film II is not formed, but the interlayer insulating film II1 is formed so as to cover the main surface of the semiconductor substrate SUB.

Since both the deep p-type diffusion layer DPW and the p-type buried layer PBL are regions containing the p-type impurity, all the regions serve as the regions containing the p-type impurity in the substrate electrode region. For this reason, for example, it becomes possible to electrically couple the wiring layer formed over the p-type epitaxial layer PE2 (deep p-type diffusion layer DPW) to the p-type impurity region PSB, in the substrate electrode region.

On the other hand, in the CMOS transistor region and the high-voltage MOS transistor region, the n-type buried layer NBL is formed since electrical coupling is cut off between, for example, the high-voltage n-type well region HNW (p-type epitaxial layer PE2) and the p-type impurity region PSB below the semiconductor substrate SUB, where the element is formed. If this n-type buried layer NBL is formed in the substrate electrode region, a substrate potential cannot be taken out since p-n junction is formed in the region. For this reason, in the comparative example of FIG. 17, the n-type buried layer NBL needs to be patterned so as not to be formed in the substrate electrode region (in other words, so that the n-type buried layer NBL is formed only in the CMOS transistor region and the like).

However, if as in the present embodiment, the substrate contact SCN formed utilizing the same concave portion as the concave portion TI for forming the element isolation region DTR is used for the substrate electrode region, the n-type buried layer NBL similar to the CMOS transistor region and the like may be formed also in the substrate electrode region. This is because, as to the substrate contact SCN, conduction with the p-type impurity region PSB is made by the substrate contact conductive layer CDL in the concave portion TI, and because, as long as the substrate contact SCN is used, a conductive type of the impurities that fill the semiconductor region around the substrate contact SCN does not affect the conductivity of the substrate contact SCN. For this reason, in the present embodiment, patterning need not be performed so that the n-type buried layer NBL is locally (selectively) formed, and the n-type buried layer NBL may be formed on the entire semiconductor substrate SUB in the plan view.

Accordingly, a process of patterning the n-type buried layer NBL can be skipped, and preparation of a mask for patterning the n-type buried layer NBL becomes unnecessary. Therefore, processes can be more simplified, and manufacturing cost can be reduced.

Figure 18A:
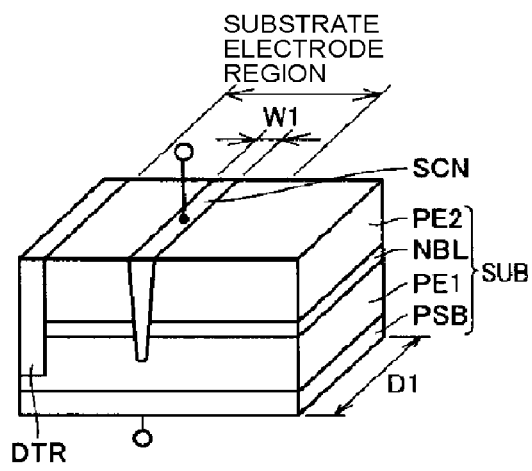
FIG. 18A is a schematic perspective diagram showing a configuration and a size of a substrate contact in the First Embodiment.
Figure 18B:
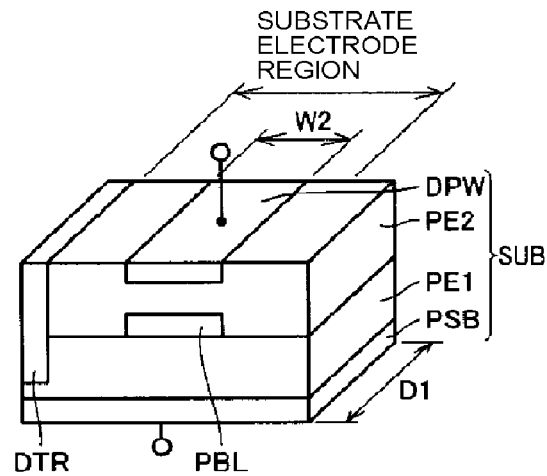
FIG. 18B is a schematic perspective diagram showing a configuration and a size of a substrate contact in the comparative example.

In addition, referring to perspective diagrams of FIGS. 18A and 18B, by the application of the substrate contact SCN of the present embodiment, an electric resistance of the substrate contact can be reduced compared with a case of using the deep p-type diffusion layer DPW and the substrate contact including the p-type buried layer PBL as in the comparative example. Here, the electric resistance of the substrate contact means an electric resistance value from the upper-side surface of the p-type epitaxial layer PE2, which is an uppermost layer of the semiconductor substrate SUB, to the upper-side surface of the p-type impurity region PSB, which is a lowermost layer of the semiconductor substrate SUB.

For this reason, if the present embodiment is applied, a width W1 (in relation to a horizontal direction of FIG. 18A) of the substrate contact SCN shown in FIG. 18A can be made smaller than a width W2 of the substrate contact shown in FIG. 18B. This is because it is necessary to deeply form a diffusion layer by performing heat treatment for a long time, for example, when the deep diffusion layer DPW is formed as a component member of the substrate contact as in FIG. 18B, thus a region of the diffusion layer becomes excessively wide in the plan view, and an area of the substrate contact may increase.

As a result, also in a case where a depth D1 of the substrate contact SCN shown in FIG. 18A and a depth D1 of the substrate contact shown in FIG. 18B are equal to each other, the area occupied by the substrate contact can be made smaller in the plan view in FIG. 18A compared with FIG. 18B. Accordingly, a size of the semiconductor chip CHP (refer to FIG. 1) in which the semiconductor device is formed can be decreased.

Second Embodiment

The substrate contact SCN in one embodiment may be formed as a drain electrode electrically coupled to a drain region of a so-called vertical MOS transistor as an element.

Figure 19:
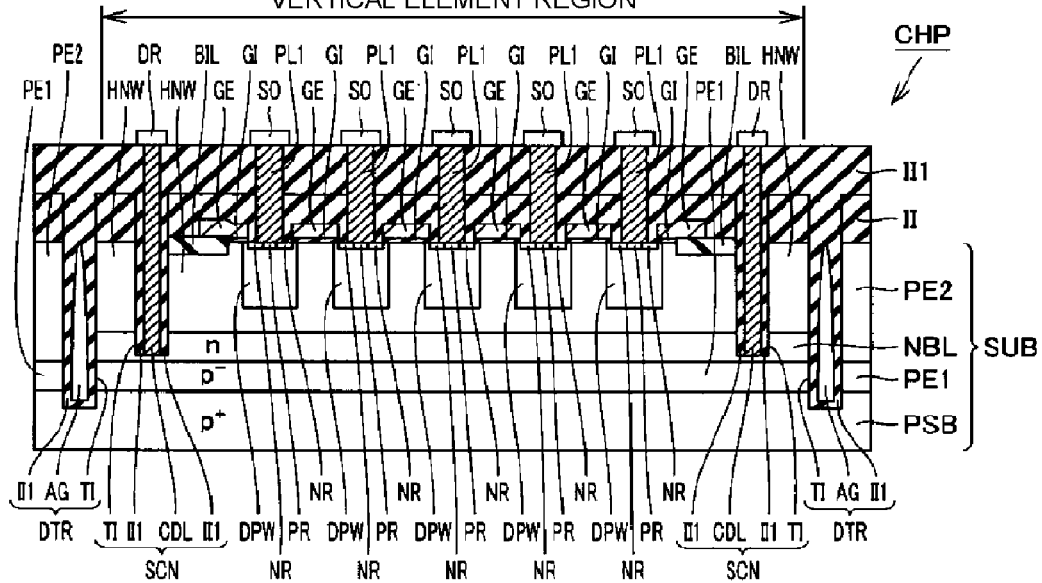
FIG. 19 is a schematic cross-sectional diagram in a portion similar to the portion along the line of FIG. 1 showing a configuration of a semiconductor device in a chip state in a Second Embodiment.

Referring to FIG. 19, the semiconductor substrate SUB of the present embodiment has a configuration in which the p-type impurity region PSB, the p-type epitaxial layer PE1, the n-type buried layer NBL, and the high-voltage n-type well region HNW have been stacked in this order. In addition, the semiconductor substrate SUB has the p-type epitaxial layer PE2 as the same layer as the high-voltage n-type well region HNW around the high-voltage n-type well region HNW via the element isolation region DTR.

A vertical element region is formed in the high-voltage n-type well region HNW, and a plurality of vertical MOS transistors is arranged in the vertical element region so as to align in a direction along the main surface of the semiconductor substrate SUB. Each vertical MOS transistor mainly has: the deep p-type diffusion layer DPW; the plug conductive layer PL1; the substrate contact SCN; a source wiring layer SO; and a drain wiring layer DR. In addition to that, there are shown in FIG. 19: the gate insulating film GI constituting the vertical MOS transistor; the gate electrode layer GE; and a buried insulating film BIL.

The deep p-type diffusion layer DPW is the p-type impurity region as the source region formed in the high-voltage n-type well region HNW. The plug conductive layer PL1 is formed so as to penetrate through the interlayer insulating film II and the interlayer insulating film II1 in the same way as the plug conductive layer PL1 of the First Embodiment, and is formed so as to reach the n$^+$ region NR and the p$^+$ region PR, which will be mentioned later, formed at the deep p-type diffusion layer DPW. The source wiring layer SO corresponds to the wiring layer ICL1 of the First Embodiment, and is formed so as to cover the plug conductive layer PL1.

The substrate contact SCN in the present embodiment has a configuration in which the insulating film II1 and the substrate contact conductive layer CDL have been formed inside the concave portion TI in the same way as the substrate contact SCN of the First Embodiment. In FIG. 19, as one example, the substrate contact SCN as the drain electrode extends so as to reach an inside of the n-type buried layer NBL as the drain region from the main surface of the semiconductor substrate SUB, and electrically couples the drain wiring layer DR to the n-type buried layer NBL. The drain wiring layer DR corresponds to the wiring layer ICL1 of the First Embodiment, and is formed so as to cover the substrate contact SCN. In addition, the element isolation region DTR in the present embodiment also has a configuration in which the insulating film II1 and the hollow AG have been formed inside the concave portion TI in the same way as the element isolation region DTR of the First Embodiment.

The n+ region NR, the p+ region PR, and the n+ region NR are arranged so as to align in this order, on the main surface of the semiconductor substrate SUB (high-voltage n-type well region HNW) in which the deep p-type diffusion layer DPW as the source region is formed.

Among these, the n+ region NR is the region where the source wiring layer SO and the high-voltage n-type well region HNW, and the n-type buried layer NBL and the drain region are electrically coupled to each other by utilizing an electric field effect generated in the high-voltage n-type well region HNW directly under the gate electrode layer GE and the gate insulating film GI. In addition, the p+ region PR is arranged in order to constitute a so-called back gate structure of electrically coupling the p+ region PR to the deep p-type diffusion layer DPW right thereunder.

The configuration of the present embodiment differs in the above points as compared with the configuration of the First Embodiment, and since the other points are similar to the configuration of the First Embodiment, the same symbol is attached to the same element, and explanation thereof is not repeated.

Next, operational effects of the present embodiment will be explained with reference to a comparative example of FIG. 20. Meanwhile, although the operational effects similar to the First Embodiment are basically exerted also in the present embodiment, here will be explained additional operational advantage to the operational advantage of the First Embodiment.

Figure 20:
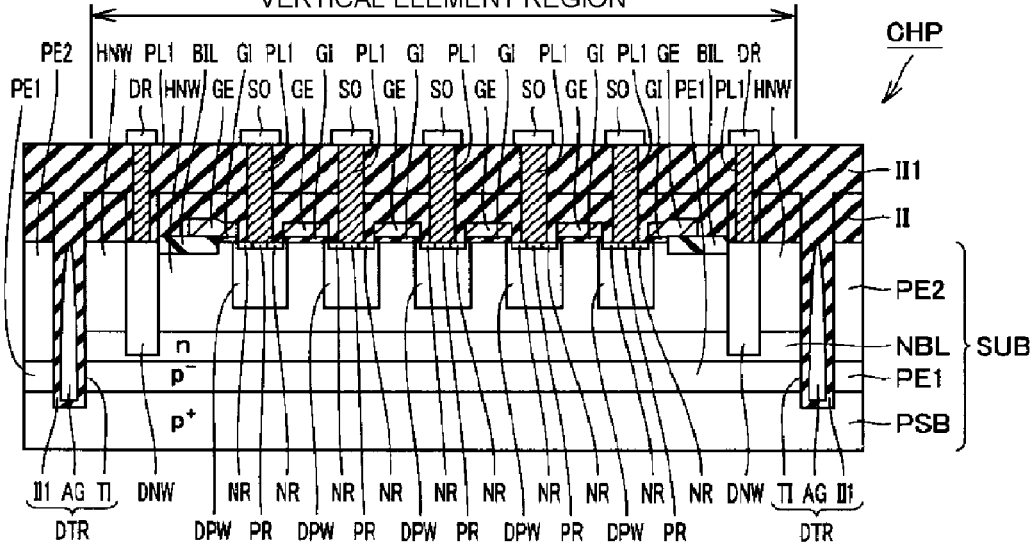
FIG. 20 is a schematic cross-sectional diagram in a portion similar to the portion along the line of FIG. 1 showing a configuration of a semiconductor device in a chip state in a comparative example of the Second Embodiment.

Referring to FIG. 20, although a semiconductor chip CHP as the comparative example of the present embodiment has a configuration basically similar to the semiconductor chip CHP of the present embodiment of FIG. 19, a drain electrode is not the substrate contact SCN, but is formed of a deep n-type diffusion layer DNW extending so as to reach the n-type buried layer NBL from the main surface of the semiconductor substrate SUB. Although FIG. 20 differs from FIG. 19 in this point, the other points are basically similar to FIG. 19, and thus the same symbol is attached to the same element and explanation thereof is not repeated.

The drain region is formed using the substrate contact SCN as in the present embodiment, and thus an electric resistance of the drain region can be significantly reduced compared with the case where the drain region is formed of the deep n-type diffusion layer DNW. As a result, performance of a semiconductor device (semiconductor element) mounted on the semiconductor chip CHP can be significantly enhanced.

In addition, when the deep n-type diffusion layer DNW is formed as the drain region, prolonged heat treatment needs to be performed, thus a diffusion layer widens, and an area thereof in the plan view becomes large, but if the drain region is formed as the substrate contact SCN, an area in the plan view of the drain region can be decreased. For this reason, in the present embodiment, a size of the semiconductor chip CHP (refer to FIG. 1) in which the semiconductor device is formed can be decreased.

Third Embodiment

The substrate contact SCN (substrate contact conductive layer CDL) in one embodiment may have an active barrier region constituting a so-called active barrier structure.

Figure 21:
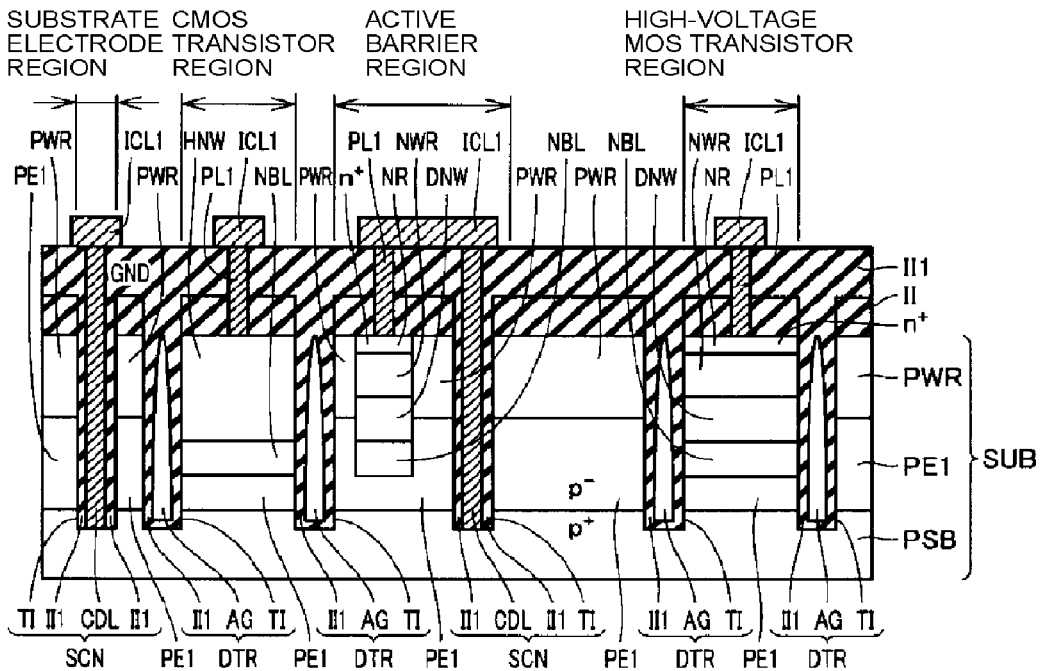
FIG. 21 is a schematic cross-sectional diagram in a portion similar to the portion along the line of FIG. 1 showing a configuration of a semiconductor device in a chip state in a Third Embodiment.

Referring to FIG. 21, the semiconductor substrate SUB of the present embodiment has a configuration in which, for example, the p-type impurity region PSB, the p-type epitaxial layer PE1, and the p-type well region PWR have been stacked in this order. In addition, also in the semiconductor chip CHP of the present embodiment, in the same way as the semiconductor chip CHP of the First Embodiment, the semiconductor substrate SUB has a CMOS transistor region (first element formation region) and a high-voltage MOS transistor region (second element formation region).

The CMOS transistor region of FIG. 21 has: the p-type epitaxial layer PE1; the n-type buried layer NBL; and the high-voltage n-type well region HNW in the same way as the CMOS transistor region of the First Embodiment of FIG. 3. However, the high-voltage MOS transistor region of FIG. 21 is simplified and shown so as to have: the p-type epitaxial layer PE1; the n-type buried layer NBL; the deep n-type diffusion layer DNW; the n-type well region NWR; and the n+ region NR. The high-voltage MOS transistor region of FIG. 21 may have such a configuration, or may have a configuration similar to the high-voltage MOS transistor region of FIG. 3.

Also in FIG. 21, in the same way as FIG. 3, the element isolation region DTR is formed so as to surround the CMOS transistor region and the high-voltage MOS transistor region, and has a configuration in which the insulating film II1 and the hollow AG have been formed inside the concave portion TI. In addition, the substrate electrode region of FIG. 21 is formed in a region where the p-type epitaxial layer PE1 and the p-type well region PWR have been stacked over the p-type impurity region PSB, and in the substrate electrode region, in the same way as the substrate electrode region of the First Embodiment of FIG. 3, there is formed the substrate contact SCN having a configuration in which the insulating film II1 and the substrate contact conductive layer CDL have been formed inside the concave portion TI. The substrate contact SCN is, for example, coupled to a ground terminal GND.

In FIG. 21, the CMOS transistor region and the high-voltage MOS transistor region are located apart from each other in relation to a direction (horizontal direction of FIG. 21) along the main surface of the semiconductor substrate SUB. An active barrier region is formed at a position between the CMOS transistor region and the high-voltage MOS transistor region.

An active barrier structure includes: a second conductive-type (n-type) second region that has a configuration in which the n-type buried layer NBL, the deep n-type diffusion layer DNW, the n-type well region NWR, and the n+ region NR have been stacked in this order; the substrate contact SCN that has a configuration similar to the other Embodiments; and the wiring layer ICL1 as a coupling conductive layer that electrically couples the second region to the substrate contact SCN. That is, the substrate contact conductive layer CDL of the substrate contact SCN is formed so as to penetrate through the interlayer insulating films II1 and II, the p-type well region PWR, and the p-type epitaxial layer PE1 to thereby reach the p-type impurity region PSB from the uppermost surface of the interlayer insulating film II1.

Since the above-described substrate contact SCN is formed so as to penetrate through the p-type well region PWR and the p-type epitaxial layer PE1 to reach the p-type impurity region PSB, it functions as a p-type region of the active barrier structure. The substrate contact SCN as the p-type region of the active barrier structure also has a configuration in which the insulating film II1 and the substrate contact conductive layer CDL have been formed inside the concave portion TI in the same way as the substrate contact SCN of the substrate electrode region.

Ohmic-coupled are the n-type region and the substrate contact SCN (particularly, the substrate contact conductive layer CDL) constituting the active barrier structure. Although the ohmic-coupled n-type region and substrate contact SCN are not shown, for example, they may be coupled to a ground terminal.

In FIG. 21 (in the same way as the other Embodiments), the p-type impurity region PSB of the semiconductor substrate SUB is formed at the entire surface in the plan view of the semiconductor substrate SUB. Namely, the p-type impurity region PSB is formed as a first conductive-type (p-type) first region so as to extend in the direction along the main surface of the semiconductor substrate SUB from the CMOS transistor region at least to the high-voltage MOS transistor region through the active barrier region.

The second conductive-type (n-type) second region constituting the active barrier structure is formed at the main surface of the semiconductor substrate SUB in the active barrier region so as to constitute p-n junction with a first conductive-type region ($p^+$ region constituting the p-type impurity region PSB) including the first region. Namely, the $n^+$ region NR that forms an uppermost layer in the second region is formed at the main surface of the semiconductor substrate SUB (p-type well region PWR). In addition, the n-type buried layer NBL that forms a lowermost layer in the second region is formed in the p-type epitaxial layer PE1.

Here will be simply explained an operating principle of the active barrier structure in the semiconductor chip CHP of FIG. 21. For example, when a negative potential is applied to the CMOS transistor region, and electrons are absorbed in the p-type impurity region PSB of the semiconductor substrate SUB from the elements, such as the CMOS transistor, the electrons move toward a high-voltage MOS transistor region side that has a higher potential than the CMOS transistor region, i.e., a right side of FIG. 21. A part of the electrons is absorbed in the n-type region of the active barrier structure. Holes similar to the absorbed electrons then move to the p-type impurity region PSB from the substrate contact SCN (that functions as the p-type region) of the active barrier structure. Consequently, a potential decreases near the substrate contact SCN (that functions as the p-type region) of the active barrier structure, which becomes a potential barrier for the electrons that try to move toward the high-voltage MOS transistor region. For this reason, the electrons become hard to move in a direction of the high-voltage MOS transistor region, and are likely to head to a deep region side (lower side of FIG. 21) of the p-type impurity region PSB. As described above, can be suppressed malfunction of the high-voltage MOS transistor due to unintentional entering of the electrons into the high-voltage MOS transistor region.

The configuration of the present embodiment differs in the above points as compared with the configuration of the First Embodiment, and since the other points are similar to the configuration of the First Embodiment, the same symbol is attached to the same element, and explanation thereof is not repeated.

Next, operational advantage of the present embodiment will be explained with reference to a comparative example of FIG. 22. Meanwhile, although the operational advantage similar to the First Embodiment are basically exerted also in the present embodiment, here, there will be explained additional operational advantage to the operational advantage of the First Embodiment.

Figure 22:
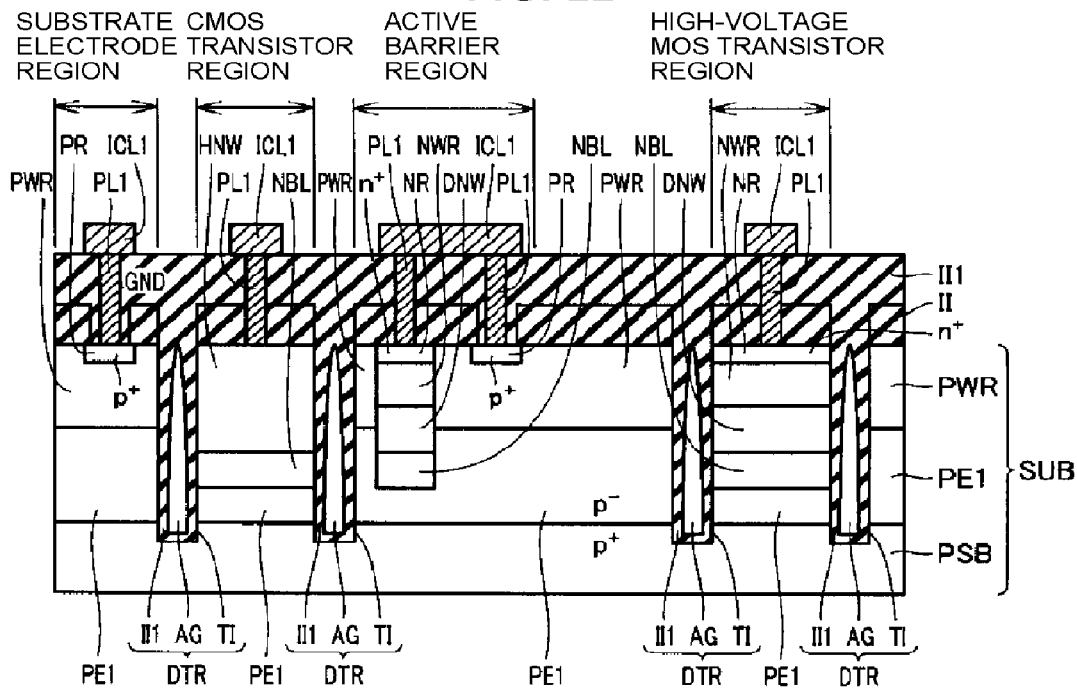
FIG. 22 is a schematic cross-sectional diagram in a portion similar to the portion along the line of FIG. 1 showing a configuration of a semiconductor device in a chip state in a comparative example of the Third Embodiment.

Referring to FIG. 22, although a semiconductor chip CHP as the comparative example of the present embodiment has a configuration basically similar to the semiconductor chip CHP of the present embodiment of FIG. 21, the p-type region of the active barrier structure is formed of the $p^+$ region PR having a comparatively high impurity concentration instead of the substrate contact SCN. Although FIG. 22 differs from FIG. 21 in this point, FIG. 22 is basically similar to FIG. 21 in the other points. Therefore, the same symbol is attached to the same element and explanation thereof is not repeated.

The p-type region of the active barrier structure is formed using the substrate contact SCN as in the present embodiment, and thus an electric resistance of the p-type region can be reduced compared with a case where the p-type region is formed of the p-type impurity region PR. As a result, movement of the holes from the substrate contact SCN as the p-type region to the p-type impurity region PSB of the substrate is performed more smoothly, and an efficiency of the active barrier structure that forms a potential barrier of the electrons can be enhanced. For this reason, a configuration of the present embodiment can enhance a function of the active barrier structure further more than the configuration of the comparative example.

Fourth Embodiment

Figure 23:
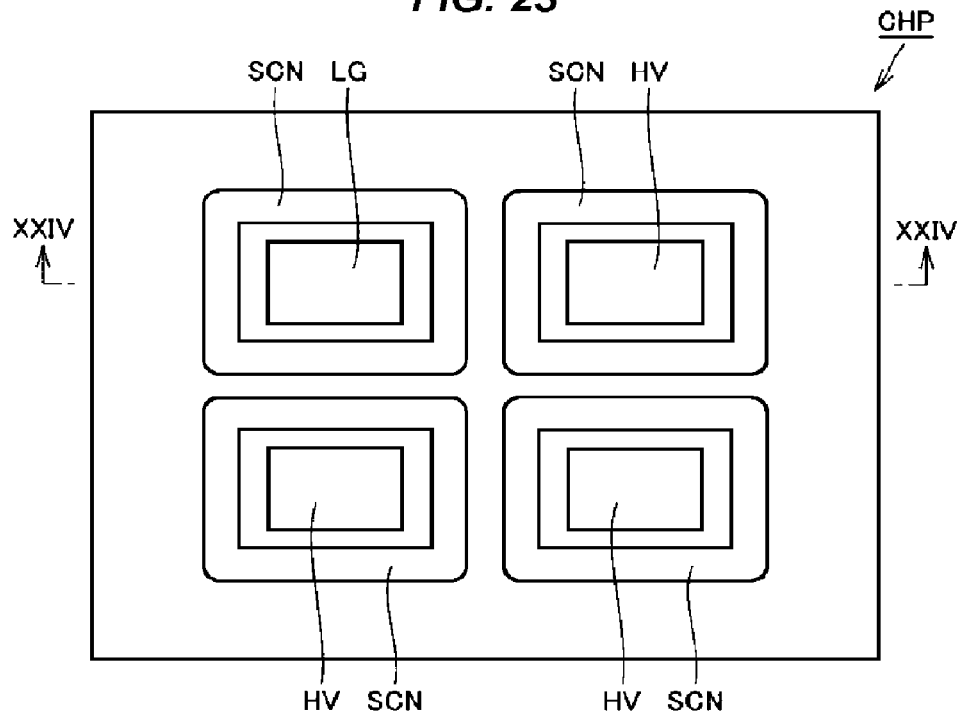
FIG. 23 is a schematic plan diagram showing a configuration of a semiconductor device in a chip state in a Fourth Embodiment.
Figure 24:
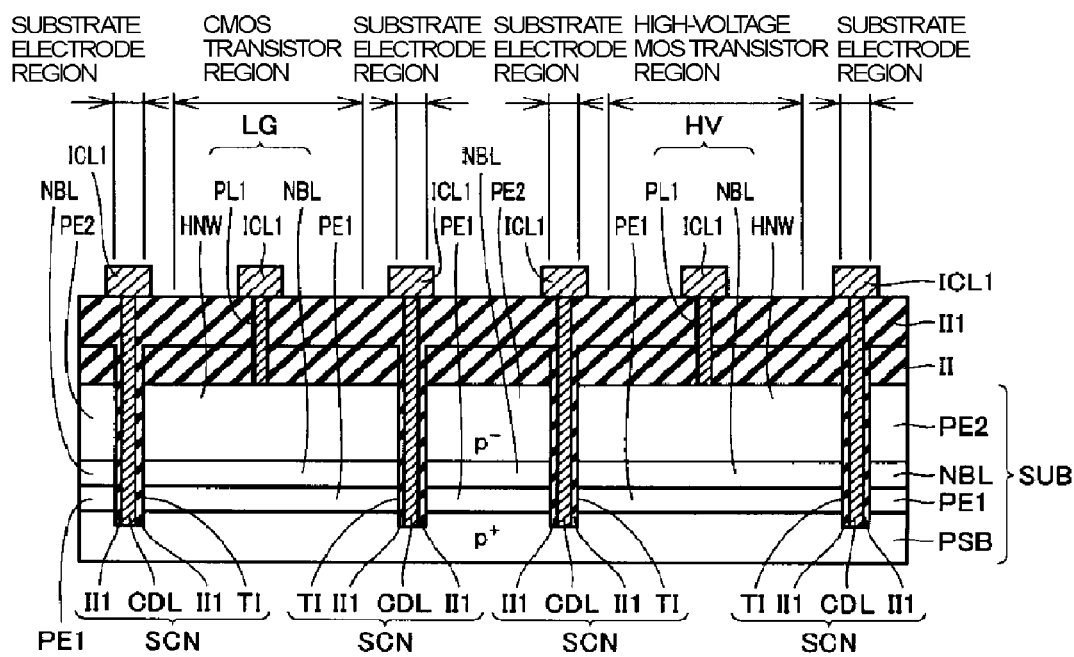
FIG. 24 is a schematic cross-sectional diagram in a portion along a line XXIV-XXIV of FIG. 23 showing the configuration of the semiconductor device in the chip state in the Fourth Embodiment.
Figure 25:
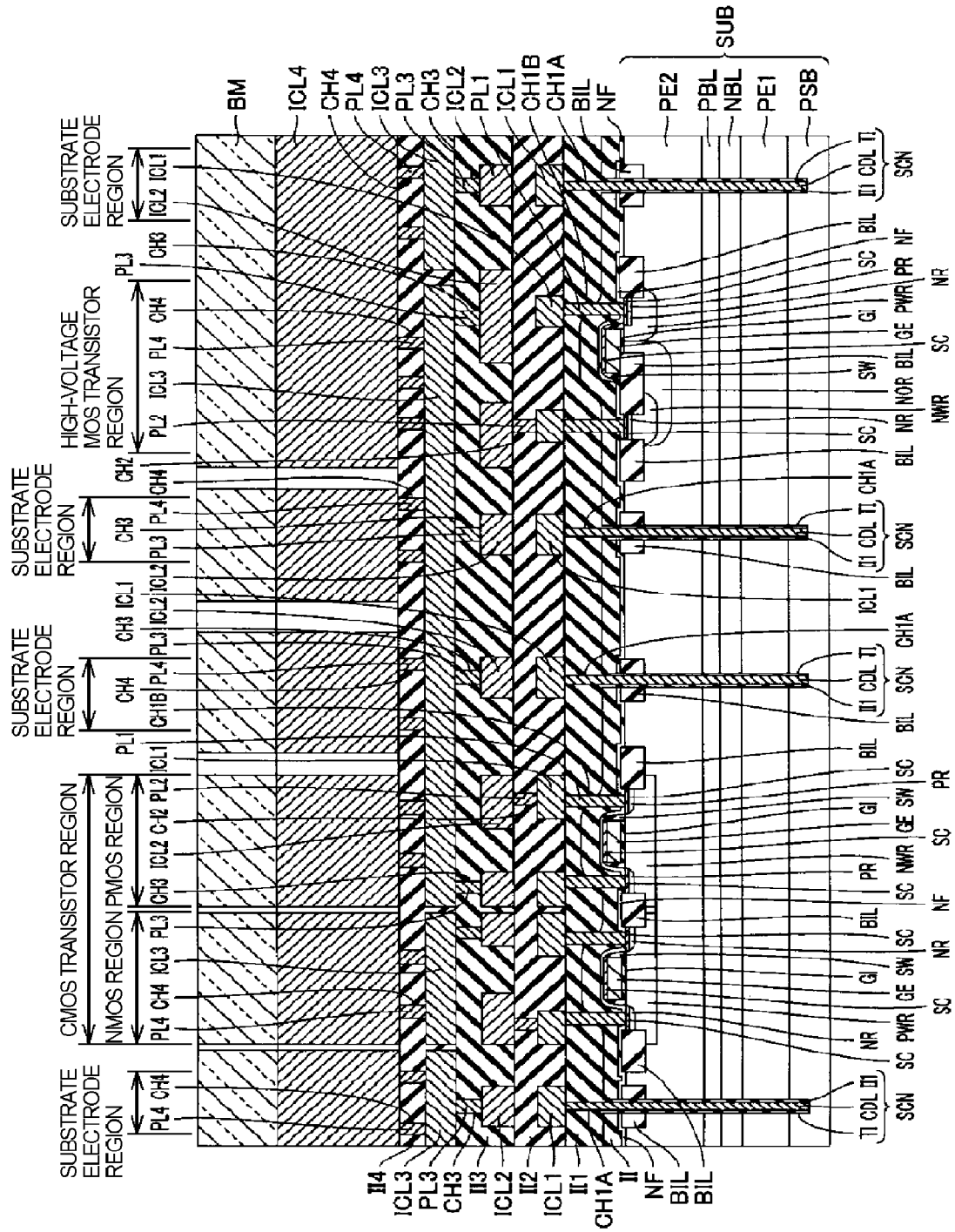
FIG. 25 is a schematic cross-sectional diagram showing in detail aspects of an element or the like formed in each region of FIG. 24.

Referring to FIGS. 23 to 25, in the present embodiment, all the concave portions TI essentially formed for the formation of the element isolation region DTR are used in order to form the substrate contact SCN. In this point, the present embodiment is different from the First Embodiment in which only a part of the concave portion TI (i.e., only the first concave portion TI formed in the substrate electrode region) essentially formed for the formation of the element isolation region DTR is used in order to form the substrate contact SCN, and the other concave portions TI are used as the second concave portion TI for forming the element isolation region DTR.

Specifically, referring to FIG. 23, in a semiconductor chip CHP of the present embodiment, the substrate contact SCN is formed in the region (around the logic portion LG and the output driver portion HV) where the element isolation region DTR is formed in the semiconductor chip CHP of FIG. 1. In other words, in the semiconductor chip CHP of the present embodiment, the logic portion LG and the output driver portion HV are surrounded by the substrate contact SCN in the plan view.

The element isolation region DTR is not formed in FIG. 23. In addition, in FIG. 23, the substrate contact SCN is not formed in the region where the substrate contact SCN is formed in FIG. 1.

Similarly, referring to FIGS. 24 and 25, in the present embodiment, the substrate electrode region (substrate contact SCN) is formed so as to surround the CMOS transistor region and the high-voltage MOS transistor region. In this point, the present embodiment is different from the First Embodiment (FIGS. 3 and 4) in which the element isolation region DTR is formed so as to surround the CMOS transistor region and the high-voltage MOS transistor region.

Meanwhile, although the substrate contact SCN of FIGS. 24 and 25 is arranged at a position more slightly apart from the CMOS transistor region or the like than the element isolation region DTR of FIGS. 3 and 4, the present embodiment is not limited to such an aspect.

Although the substrate contact SCN of the present embodiment and the above-described respective First to Third Embodiments is used as a substrate electrode for taking out a substrate potential from above, it has a configuration in which a periphery of the substrate contact conductive layer CDL is surrounded by the insulating film IL1 (interlayer insulating film IL1). For this reason, the substrate contact SCN has both of a function as the substrate electrode, and a function to electrically separate the element from the other region in the same way as the element isolation region DTR.

For this reason, by the configuration of the element formation region to be surrounded by the substrate contact SCN as in the present embodiment, the element formation region can be electrically separated from the other region, and the substrate potential can be taken out.

In addition, since the substrate contact SCN has the function similar to the element isolation region DTR, it becomes unnecessary to form the element isolation region DTR as in the First Embodiment. In addition, in the present embodiment, it becomes unnecessary to form anything in the region where the substrate contact SCN in FIG. 1 is formed. For this reason, constituent elements of the semiconductor chip CHP can be reduced, and the size of the semiconductor chip CHP can be reduced.

Hereinbefore, although the invention made by the present inventor has been specifically explained on the basis of the embodiments, the present invention is not limited to the above-described embodiments, and it is needless to say that various modifications are possible within the scope not departing from the gist of the invention.

What is claimed is:

1. A method for manufacturing a semiconductor device, comprising:
    forming a MOS transistor that has:
        a source region and a drain region located in a semiconductor substrate at a main surface of the semiconductor substrate,
        a gate insulating film on the main surface, and
        a gate electrode on the gate insulating film;
    forming a first concave portion that extends into the semiconductor substrate from the main surface;
    forming an insulating film over the main surface, and over a side wall and a bottom wall of the first concave portion so as to cover the MOS transistor and to form a capped void in the first concave portion;
    forming a first hole portion in the insulating film so as to reach the void in the first concave portion from an upper surface of the insulating film, and to reach the semiconductor substrate at the bottom wall of the first concave portion while leaving the insulating film over the side wall of the first concave portion, and, at a same time, forming a second hole portion that reaches the source region or the drain region from the upper surface of the insulating film; and
    forming a conductive layer in the first hole portion so as to be electrically coupled to the semiconductor substrate, and, at a same time, forming the conductive layer in the second hole portion so as to be electrically coupled to the source region or the drain region.

2. The method for manufacturing the semiconductor device according to claim 1,
    wherein the semiconductor substrate has first and second element formation regions that are located apart from each other, and a first active barrier region that is located between the first and second element formation regions,
    the method further comprising:
    forming a first conductive-type first region in the semiconductor substrate so as to extend from the first element formation region at least to the second element formation region through the active barrier region;
    forming a second conductive-type second region at the main surface in the active barrier region so as to constitute a p-n junction with a first conductive-type region including the first region; and
    forming a coupling conductive layer that is located over the main surface and electrically couples the conductive layer in the first hole portion to the second region,
    wherein the conductive layer in the first hole portion is formed so as to reach the first region in the active barrier region.

3. The method for manufacturing the semiconductor device according to claim 1, further comprising:
    forming a first conductive-type substrate region in the semiconductor substrate; and
    forming a second conductive-type buried region that is located closer to the main surface than the substrate region,
    wherein the first concave portion is formed so as to penetrate through the buried region to thereby reach the substrate region.

4. The method for manufacturing a semiconductor device according to claim 1,
    wherein after the forming the first hole portion and before the forming the conductive layer in the first hole portion, an open void extends from a plane of the upper surface of the insulating film to the bottom wall of the first concave portion, and
    wherein the forming the conductive layer in the first hole portion fills said open void with the conductive layer.

5. The method for manufacturing the semiconductor device according to claim 1, further comprising:
    forming a second concave portion that extends into the semiconductor substrate from the main surface,
    wherein the insulating film is also formed over a side wall and a bottom wall of the second concave portion so as to form a capped void in the second concave portion, and
    wherein the first and second concave portions are formed at a same time.

6. The method for manufacturing a semiconductor device according to claim 5, wherein after the forming the first and second hole portions and the forming the conductive layer in the first and second hole portions, the capped void remains in the second concave portion.

7. A method for manufacturing a semiconductor device, comprising:
    (a) forming a MOS transistor having source and drain regions in a semiconductor substrate and a gate electrode formed on a main surface of the semiconductor substrate via a gate insulating film;
    (b) etching the semiconductor substrate to form a first concave portion extending into the substrate from the main surface;
    (c) forming an insulating film so as to cover the MOS transistor and to cover side and bottom walls of the first concave portion, and such that a cap comprised of the insulating film is formed at an upper portion of the first concave portion while a void remains between the bottom wall and the cap;
    (d) etching the insulating film so as to form first and second holes at a same time, the first hole being formed by opening the capped void and removing the insulating film at the bottom wall of the first concave portion while leaving the insulating film over the side walls such that a first open area extends through the insulating film to the bottom wall of the first concave portion, the second hole having a second open area extending through the insulating film to one of the source and drain regions; and (e) forming, at a same time, conductive film portions in each of the first and second open areas so as to form a first conductive member in the first hole that is electrically coupled to the semiconductor substrate and a second conductive member in the second hole that is electrically coupled to one of the source and drain regions.

8. The method for manufacturing a semiconductor device according to claim 7, wherein, in (b), a second concave portion is formed at a same time as the first concave portion, the second concave portion extending into the semiconductor substrate from the main surface, and wherein, in (c), the insulating film also covers the side and bottom walls of the second concave portion and forms a second cap comprised of the insulating film at an upper portion of the second concave portion while a second void remains between the bottom wall of the second concave portion and the second cap.

9. The method for manufacturing a semiconductor device according to claim 8, wherein, after (d) and (e), the capped second void remains in the second concave portion.

* * * * *